US010104317B2

(12) United States Patent
Zhou et al.

(10) Patent No.: US 10,104,317 B2
(45) Date of Patent: Oct. 16, 2018

(54) SUPER-RESOLUTION IMAGE ACQUISITION METHODS AND ACQUISITION APPARATUS

(71) Applicant: BEIJING ZHIGU TECH CO., LTD., Beijing (CN)

(72) Inventors: Liang Zhou, Beijing (CN); Lin Du, Beijing (CN)

(73) Assignee: BEIJING ZHIGU TECH CO., LTD., Beijing (CN)

( * ) Notice: Subject to any disclaimer, the term of this patent is extended or adjusted under 35 U.S.C. 154(b) by 53 days.

(21) Appl. No.: 15/510,867

(22) PCT Filed: Sep. 10, 2015

(86) PCT No.: PCT/CN2015/089312
§ 371 (c)(1),
(2) Date: Mar. 13, 2017

(87) PCT Pub. No.: WO2016/050135
PCT Pub. Date: Apr. 7, 2016

(65) Prior Publication Data
US 2017/0280070 A1    Sep. 28, 2017

(30) Foreign Application Priority Data
Sep. 30, 2014 (CN) .......................... 2014 1 0522902

(51) Int. Cl.
H04N 5/349 (2011.01)
H04N 5/232 (2006.01)
(Continued)

(52) U.S. Cl.
CPC ....... *H04N 5/349* (2013.01); *H01L 27/14601* (2013.01); *H01L 27/14603* (2013.01);
(Continued)

(58) Field of Classification Search
None
See application file for complete search history.

(56) References Cited

U.S. PATENT DOCUMENTS

2005/0280714 A1    12/2005  Freeman
2008/0151089 A1     6/2008  Street et al.
(Continued)

FOREIGN PATENT DOCUMENTS

CN    102037717    4/2011
CN    103489173    1/2014
(Continued)

OTHER PUBLICATIONS

International Search Report and Written Opinion for Application No. PCT/CN2015/089312, dated Nov. 6, 2015, 7 pages.

*Primary Examiner* — James Hannett

(57) ABSTRACT

Embodiments of the present application disclose various super-resolution image acquisition methods and acquisition apparatuses, wherein a super-resolution image acquisition method comprises: determining sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a scene; adjusting pixel point distribution of image sensors of respective cameras in the camera array according to the sub-pixel level target offset distances; acquiring images of the scene respectively based on the cameras after adjustment; and acquiring a super-resolution image of the scene according to the acquired images. The embodiments of the present application improve imaging quality of a sub-image in the super-resolution image corresponding to the first region.

22 Claims, 13 Drawing Sheets

(51) Int. Cl.
*H04N 5/247* (2006.01)
*H04N 5/369* (2011.01)
*H01L 27/146* (2006.01)

(52) U.S. Cl.
CPC ..... *H04N 5/23219* (2013.01); *H04N 5/23229* (2013.01); *H04N 5/23267* (2013.01); *H04N 5/247* (2013.01); *H04N 5/3696* (2013.01)

(56) References Cited

U.S. PATENT DOCUMENTS

2010/0309308 A1* 12/2010 Saphier ................. G06T 7/0004
                                                                348/92
2017/0006233 A1    1/2017 Venkataraman et al.

FOREIGN PATENT DOCUMENTS

| CN | 104320596 | 1/2015 |
|---|---|---|
| JP | 2006129411 | 5/2006 |
| WO | 2014/074250 | 5/2014 |

\* cited by examiner

SUPER-RESOLUTION IMAGE ACQUISITION METHODS AND ACQUISITION APPARATUS

CROSS-REFERENCE TO RELATED APPLICATIONS

This application is a national phase application of International Application No. PCT/CN2015/089312, filed on Sep. 10, 2015, which claims the benefit of priority to Chinese Patent Application No. 201410522902.1, filed on Sep. 30, 2014, and entitled "Super-resolution Image Acquisition Methods and Acquisition Apparatus", each of which is incorporated herein by reference in its entirety.

TECHNICAL FIELD

The present application relates to the field of image processing technologies, and in particular, to image acquisition methods and acquisition apparatus.

BACKGROUND

Image resolution is one of the important indexes that evaluate image quality. In order to improve the image resolution, software processing may be performed on multiple low-resolution images obtained by photographing the same scene whose contents are similar but whose spatio and/or temporal information is not completely the same, to generate a super-resolution image. The super-resolution image is widely used for, for example, restoring high frequency information lost in different acquisition scenes, such as out-of-focus, motion blur, non-ideal sampling, etc., and can also be configured to restore high frequency spatial information beyond a diffraction limit of an optical system.

With the on-going development of imaging technologies, technologies of acquiring super-resolution images based on a camera array cause researchers to pay high attention. The camera array may also be called array-type camera or array camera, which, relative to the traditional single camera, has a wider vision and generally comprises a plurality of cameras array-distributed, wherein each camera has a separate optical lens and an image sensor. When image collection is performed on a to-be-shot scene by using a camera array, each camera in the camera array can photograph an image of the scene respectively, images obtained through photographing of different cameras have a certain vision offset therebetween, in this way, multiple images having similar contents but having scene vision can be obtained, a super-resolution image can be acquired according to the multiple images, resolution of the super-resolution image is greater than that of a single image acquired by each camera, for example, for a camera array formed by N×N cameras, suppose that the number of pixel points of an image sensor of each camera is D×D, in an ideal situation, resolution that can be generated according to the images acquired by the cameras of the camera array is ND×ND.

SUMMARY

A brief summary about the present application is given hereinafter, so as to provide a basic understanding about certain aspects of the present application. It should be understood that the summary is not an exhaustive summary about the present application. It is neither intended to determine critical or important parts of the present application, nor intended to limit the scope of the present application. Its purpose is merely giving some concepts in a simplified form, to be taken as the preamble to be described later in more detail.

Embodiments of the present disclosure provide various image acquisition methods and acquisition apparatuses which can be used to acquire super-resolution images.

In one aspect, embodiments of the present disclosure provide a super-resolution image acquisition method, comprising:

determining sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a scene;

adjusting pixel point distribution of image sensors of respective cameras in the camera array according to the sub-pixel level target offset distances;

acquiring images of the scene respectively based on the cameras after adjustment; and acquiring a super-resolution image of the scene according to the acquired images.

In another aspect, the embodiments of the present disclosure further provide a super-resolution image acquisition apparatus, comprising:

a target offset distance determination module, configured to determine sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a scene;

a pixel point distribution adjustment module, configured to adjust pixel point distribution of image sensors of respective cameras in the camera array according to the sub-pixel level target offset distances;

an image acquisition module, configured to acquire images of the scene respectively based on the cameras after adjustment; and a super-resolution image acquisition module, configured to acquire a super-resolution image of the scene according to the acquired images.

The technical solutions provided in the embodiments of the present disclosure can make full use of whole pixel points of respective image sensors of a camera array to acquire multiple different images of a scene with slight vision deviation, specifically, pixel point distribution of image sensors of respective cameras in the camera array can be adjusted according to sub-pixel level target offset distances of corresponding logic pixel points in respective to-be-adjusted regions, which respectively correspond to a first region of a scene, of image sensors of any two adjacent cameras, to cause the number of pixel points of imaging regions of the image sensors corresponding to the first region to be more under the condition that the sub-pixel level target offset distances are met, that is to say, pixel points are concentrated in the first region as many as possible in the event that the pixel points of the image sensors meet the sub-pixel level target offset distances, to cause the image sensors, on the basis of meeting sub-pixel level offset required by the super-resolution image, to increase pixel points of the to-be-adjusted regions to improve image acquisition efficiency, thereby increasing resolution of a sub-image, in the images acquired by the image sensors, corresponding to the first region, and images acquired by adjacent cameras have vision deviation corresponding to the sub-pixel level target offset distances therebetween, thereby improving imaging quality of a sub-image in the acquired super-resolution image corresponding to the first region.

These and other advantages of the present disclosure will be more evident through the following detailed description about alternative embodiments of the present disclosure with reference to the accompanying drawings.

BRIEF DESCRIPTION OF THE DRAWINGS

The present application can be better understood with reference to the description given below in combination with the accompanying drawings, in which the same or similar reference signs are used in all the drawings to indicate the same or similar components. The drawings together with the following detailed description are comprised in the specification and form a part of the specification, and are configured to further exemplify alternative embodiments of the present application and explain the principle and advantages of the present application. In the drawings.

Figure 1A:
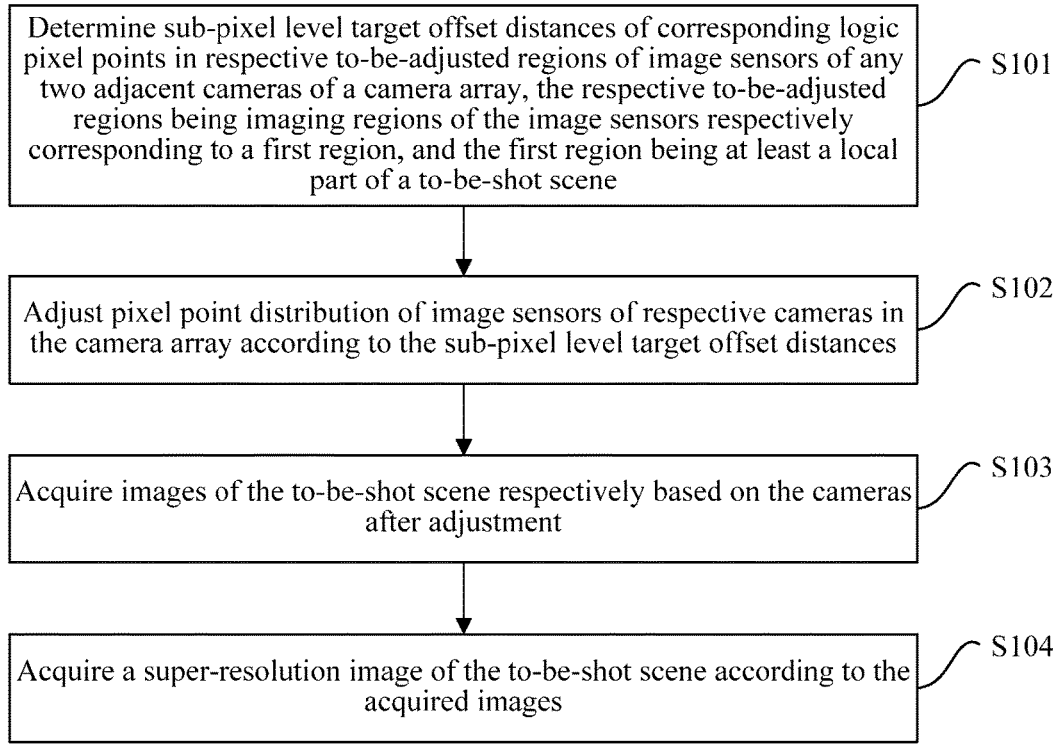
FIG. 1a is an example flowchart of a super-resolution image acquisition method according to embodiments of the present disclosure.

Those skilled in the art should understand that, elements in the drawings are merely illustrated for the sake of simplicity and clarity, and may not be drawn to scale. For example, sizes of certain elements in the drawings may be amplified relative to other elements, so as to help to improve the understanding about the embodiments of the present application.

DETAILED DESCRIPTION

Embodiments of the present disclosure are described below in detail with reference to the accompanying drawings. For the sake of clarity and simplicity, not all the features of actual implementations are described in the specification. However, it should be understood that, lots of decisions specific to implementations must be made during development of any such actual embodiment, so as to achieve specific goals of developers, for example, restrictions relevant to systems and services are met, and the restrictions may vary with different implementations. In addition, it should also be understood that, although development work is likely to be very complicated and time-consuming, for those skilled in the art who benefit from the disclosure, the development work is merely a routine task.

Herein, it should also be noted that, in order to avoid blurring the present application due to unnecessary details, only apparatus structures and/or processing steps closely related to solutions according to the present application are described in the accompanying drawings and the specification, but representation and description about members and processing having little to do with the present application and known to those of ordinary skill in the art are omitted.

Exemplary implementations of the present disclosure are described in detail hereinafter with reference to the accompanying drawings and embodiments (in which the same elements are denoted by the same reference numerals). The following embodiments are intended to describe the present application, but not to limit the scope of the present application.

It should be understood by those skilled in the art that the terms such as "first" and "second" in the present application are merely intended to distinguish different steps, devices or modules, etc., which neither represent any particular technical meaning nor indicate a necessary logical sequence between them.

The inventor has found in the process of practicing the embodiments of the present disclosure that, generally, when image acquisition of a to-be-shot scene is performed based on a camera array, pixels of image sensors of cameras of the camera array are evenly distributed, multiple images where the scene has slight vision deviation may be obtained based on acquisition of the image sensors, and a super-resolution image can be acquired based on the images. However, in some scenes, different regions of the scene usually have different meanings and/or significance for users, that is, users do not have the same requirements for imaging quality of different regions of the to-be-shot scene. For example, in a character shot scene, the interest level of the user for human faces in the scene is higher than that for scenery in the scene, and thus requirements for image spatial resolution and signal to noise ratio (SNR) of imaging of the part of human faces in the acquired super-resolution image are higher; and so on. To this end, the embodiments of the present disclosure provide a super-resolution image acquisition method, which can make full use of whole pixel points of respective image sensors of a camera array to acquire multiple different images of a to-be-shot scene with slight vision deviation, to thus better meet users' diversified application demands. The technical solution is further described below with reference to the accompanying drawings.

FIG. 1a is a flowchart of a super-resolution image acquisition method according to embodiments of the present disclosure. An execution body of the super-resolution image acquisition method according to the embodiments of the present disclosure may be a certain super-resolution image acquisition apparatus, and the super-resolution image acquisition apparatus may perform static or dynamic image processing control by executing the super-resolution image acquisition method during applications, which comprise, but are not limited to, phototaking, camera shooting, photographing and video monitoring. Device manifestations of the super-resolution image acquisition apparatus are not limited, for example, the super-resolution image acquisition apparatus may be a certain separate component, and the component cooperates with the camera array for communications; or the super-resolution image acquisition apparatus may be integrated into a camera array as a certain functional module, which is not limited in the embodiments of the present disclosure.

Specifically, as shown in FIG. 1a, a super-resolution image acquisition method according to embodiments of the present disclosure comprises:

S101: Determine sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a to-be-shot scene.

The camera array may comprise N×M cameras array-distributed, wherein N is an integer greater than or equal to 1, and M is an integer greater than 1, or N is an integer greater than 1, and M is an integer greater than or equal to 1.

Each camera in the camera array has a separate optical lens and an image sensor, the cameras in the camera array are homogeneous or at least part of the cameras are heterogeneous, optical lenses of the cameras may be provided with different filtering elements according to actual requirements, for example, blue filtering elements, red filtering elements or green filtering elements, etc. The embodiments of the present disclosure might as well takes a camera array formed through array distribution of a plurality of homogeneous cameras as an example for description, and the heterogeneous camera array also has a similar technical solution, which is not repeated in the embodiments of the present disclosure.

Figure 2A:
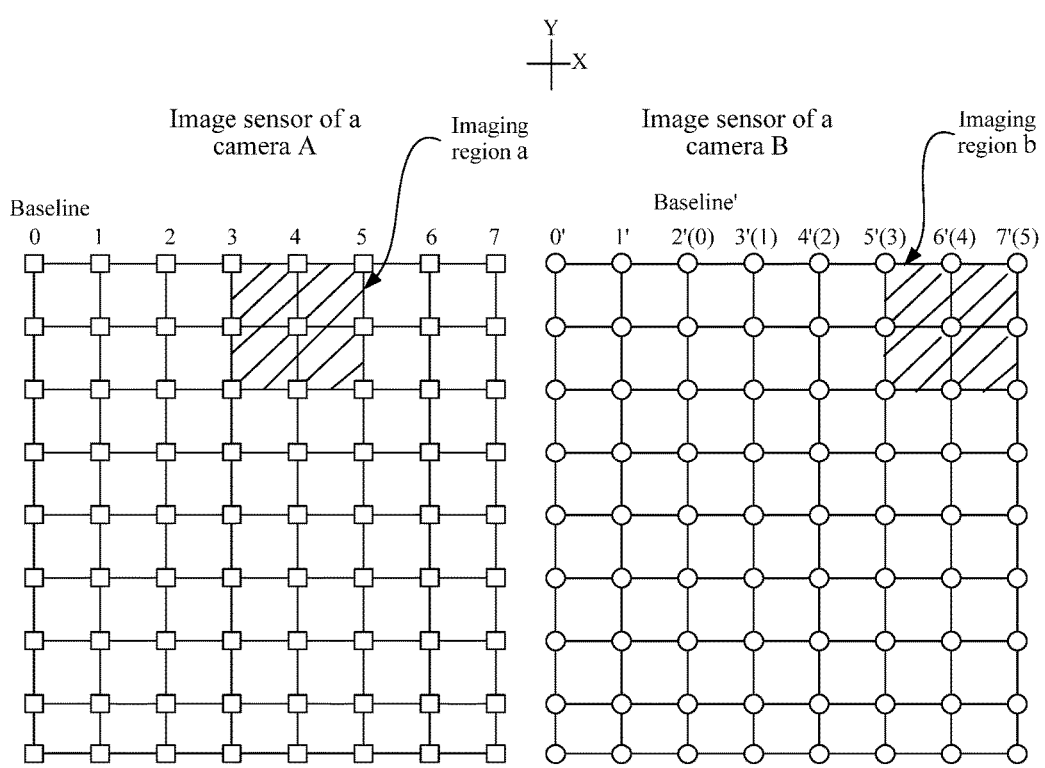
FIG. 2a is an example of pixel point distribution of image sensors of cameras in a camera array according to embodiments of the present disclosure.

Each pixel point of an image sensor of each camera can provide logic information, and the logic information may also be called pixel index information, configured to indicate the pixel point is which pixel point in the image sensor, for example, the pixel is the mth pixel point in the nth row. A reference line (also called baseline) between image sensors of two adjacent cameras in the camera array may introduce parallax offset, in this way, for imaging regions of adjacent image sensors correspond to the first region of the to-be-shot scene, and positions in respective imaging regions of image sensors of two adjacent cameras do not completely correspond. In consideration of the baseline offset, logic pixel points corresponding to adjacent image sensors are the corresponding logic pixel points in the embodiments of the present disclosure, and information of the same part of the to-be-shot scene is respectively recorded at the corresponding logic pixel points of the adjacent image sensors. A corresponding relationship of logic information of pixel points of the adjacent image sensors can be obtained according to an offset relationship between baselines of the adjacent image sensors, and according to the corresponding relationship of logic information of pixel points, in two adjacent image sensors, which logic pixel point of one image sensor corresponds to a certain logic pixel point of the other image sensor can be determined. For example, referring to FIG. 2a, suppose that baselines of image sensors of two adjacent cameras A, B have an offset of two pixels in an X direction, logic information of a certain row of the image sensor A is pixel points of 0, 1, 2, 3, 4 . . . , and logic information of the same row of the image sensor B is pixel points of 2', 3', 4', 5', 6' . . . (a corresponding relationship of pixel point logic or sequence number information is marked in parentheses of FIG. 2a), which are respectively corresponding logic pixel points; as shown in FIG. 2a, imaging regions a, b of the same part of the to-be-shot scene respectively corresponding to the respective image sensors of the cameras A and B also have a certain offset.

In order to acquire an image whose resolution is higher than that of an image acquired by a certain single camera in the camera array, that is, a super-resolution image, corresponding logic pixel points of image sensors of any two adjacent cameras in the camera array can be distributed according to a certain sub-pixel level distance offset.

Figure 2B:
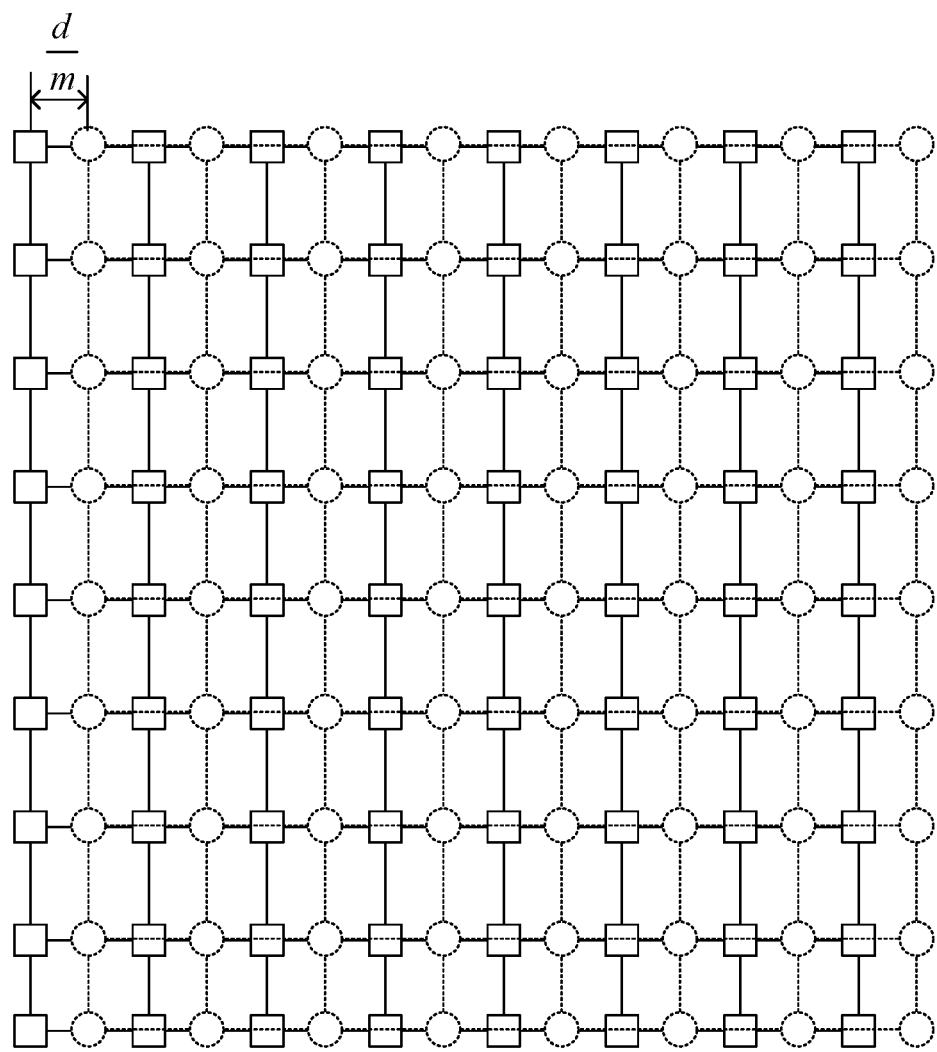
FIG. 2b is an example of offset of corresponding logic pixel points of image sensors of adjacent cameras according to embodiments of the present disclosure.
Figure 2C:
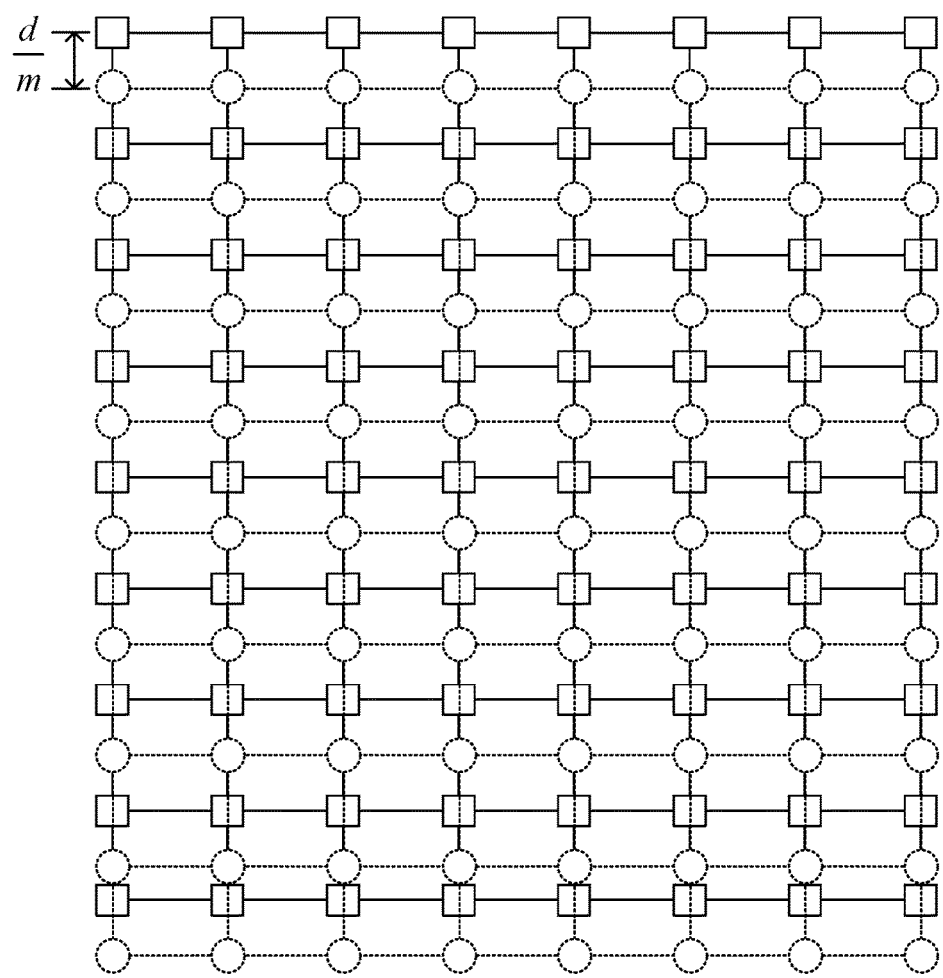
FIG. 2c is an example of offset of corresponding logic pixel points of image sensors of adjacent cameras according to embodiments of the present disclosure.
Figure 2D:
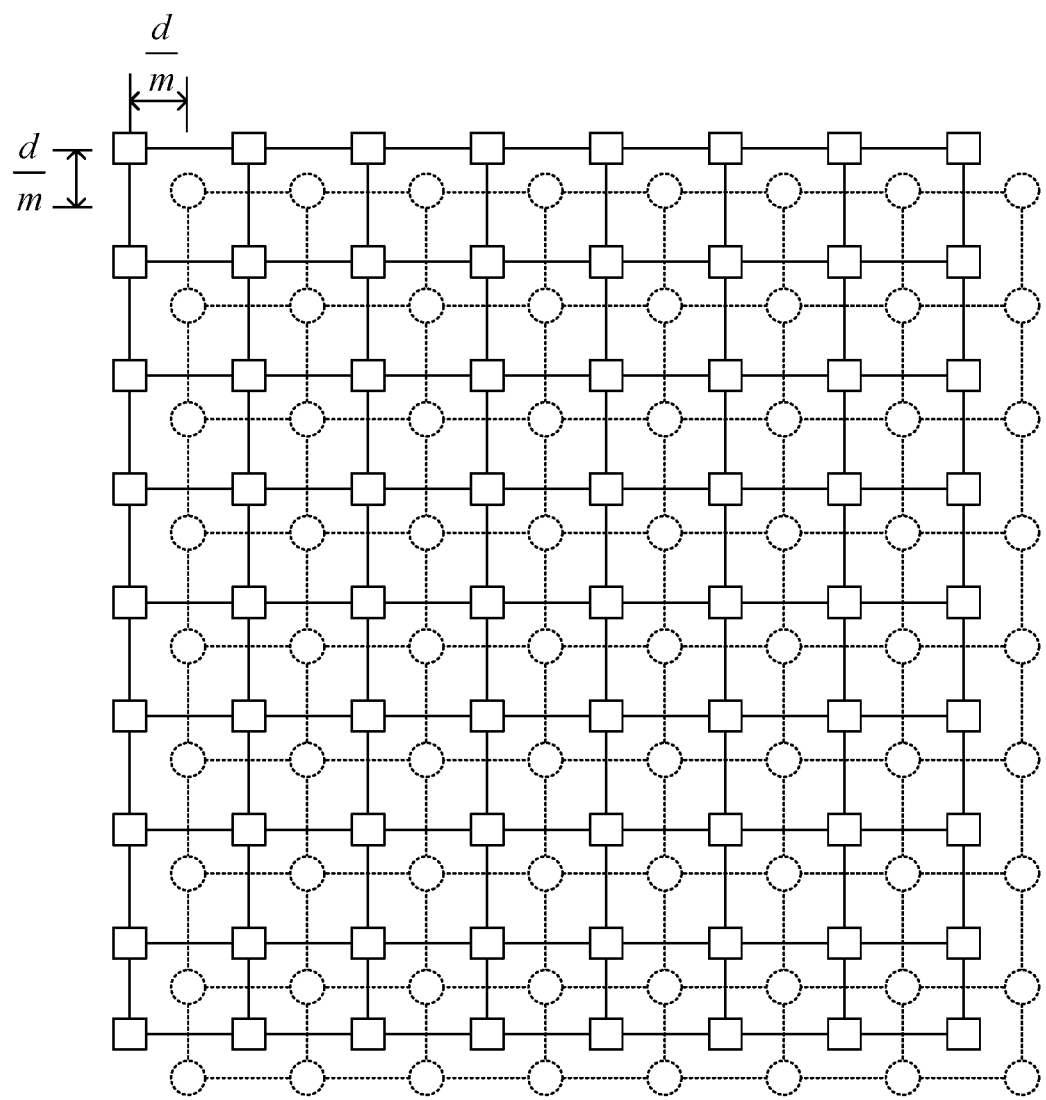
FIG. 2d is an example of offset of corresponding logic pixel points of image sensors of adjacent cameras according to embodiments of the present disclosure.

A distance between centers of any two adjacent pixel points of an image sensor before adjustment is called a pixel pitch d, the "sub-pixel level distance" is a certain distance less than the pixel pitch d, for example, $$\frac{d}{m},$$

wherein m>1. It might as well indicate row direction and column direction of the camera array as X direction and Y direction respectively. Corresponding logic pixel points of image sensors of any two adjacent cameras in the camera array (e.g., any two adjacent cameras in the same row of the camera array, or any two adjacent cameras in the same column) have a sub-pixel level offset distance in at least one of the X direction and the Y direction. It might as well take a camera array formed by two cameras according to 1×2 array distribution as an example for description, if a baseline offset of image sensors of two cameras (camera A and camera B) in the camera array is not considered or cancelled, relative coordinates of corresponding logic pixel points of the image sensors of the two cameras in the camera array have a sub-pixel level distance offset, FIG. 2b illustrates an optional situation where a corresponding logic pixel point in the X direction (e.g., the first pixel in the first row of each image sensor) has a $$\frac{d}{m}$$

distance offset, FIG. 2c illustrates an optional situation where a corresponding logic pixel point in the Y direction (e.g., the first pixel in the first row of each image sensor) has a $$\frac{d}{m}$$

distance offset, and FIG. 2d illustrates an optional situation where corresponding logic pixel points in the X direction and the Y direction (e.g., the first pixel in the first row of each image sensor) have a $$\frac{d}{m}$$

distance offset. In this way, when image acquisition of a to-be-shot scene is performed based on a camera array, cameras of the camera array can obtain images whose contents are similar to but not completely the same as the contents of the scene, the information collected for the scene by the acquired images are not completely the same, information in the scene not collected by a certain image may be collected in another image, and thus a super-resolution image can be generated according to images obtained by one shot of the camera array.

The sub-pixel level target offset distance can be configured to represent relative expectation of a user or device for image definition of the first region of the to-be-shot scene, and during actual applications, the sub-pixel level target offset distance may be determined according to, but not limited to, expected gain of the super-resolution image. For example, if expected gain for a sub-image in the super-resolution image corresponding to the first region is higher, it is required that the sub-image can acquire higher image resolution, and a smaller sub-pixel level target offset distance of a region (i.e., the to-be-adjusted region) corresponding to the first region can be set, to cause the image sensors, on the basis of meeting sub-pixel level offset required by the super-resolution image, to increase pixel points of the to-be-adjusted regions, thereby increasing resolution of a sub-image, in the images acquired by the image sensors, corresponding to the first region, and images acquired by adjacent cameras have vision deviation corresponding to the sub-pixel level target offset distances therebetween, thereby improving imaging quality of a sub-image in the acquired super-resolution image corresponding to the first region.

S102: Adjust pixel point distribution of image sensors of respective cameras in the camera array according to the sub-pixel level target offset distances.

Figure 3:
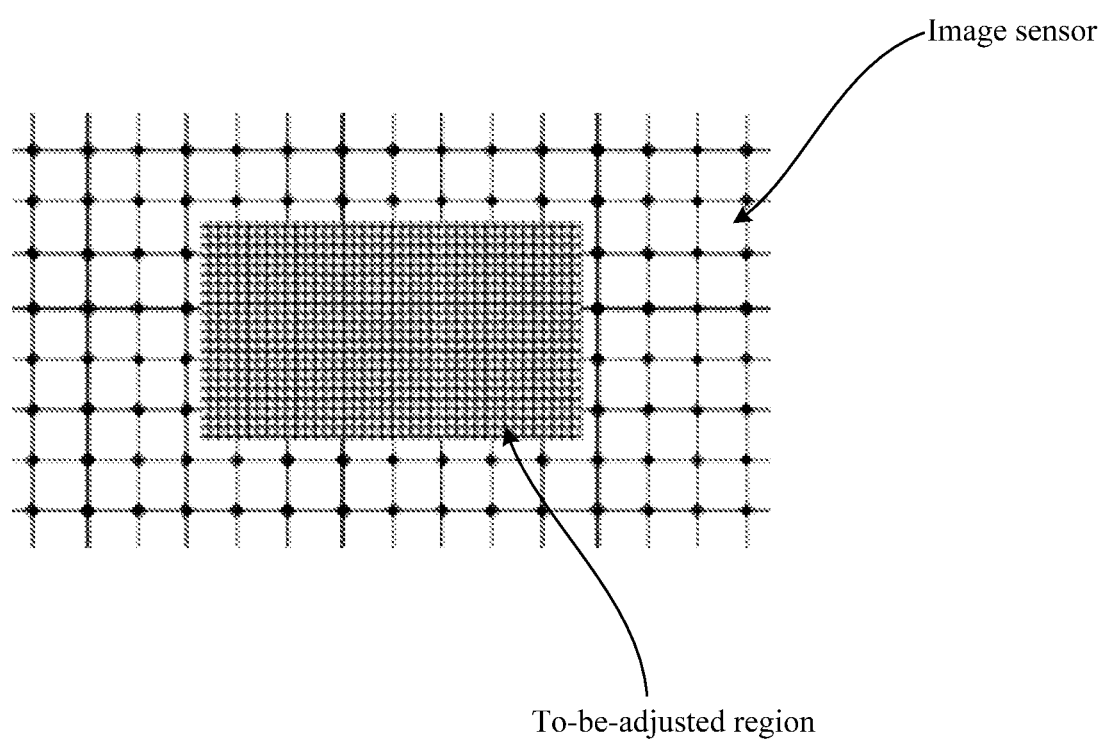
FIG. 3 is an example of pixel point distribution of image sensors after adjustment according to embodiments of the present disclosure.

The image sensors in the embodiments of the present disclosure are image sensors with adjustable pixel density, which may comprise, but not limited to, flexible image sensors, and the flexible image sensors each comprise a flexible substrate and a plurality of image sensor pixels formed on the flexible substrate, wherein the flexible substrate, when met a certain condition, may adjust pixel density distribution thereof through scaling, bending or other changes. In combination with the characteristic that the pixel density distribution of the image sensors is adjustable, the embodiments of the present disclosure adjust pixel point distribution of the image sensors, to cause actual coordinate offsets of the corresponding logic pixel points in the image sensors of the adjacent cameras in the camera array to be equal to or near the sub-pixel level target offset distances as much as possible. The pixel points of the image sensors before adjustment can be evenly distributed. The pixel points of the image sensors after adjustment can become unevenly distributed, that is, the number of pixel points of imaging regions of any image sensor corresponding to image collection of the first region is more, and spacing between adjacent pixel points is smaller; while the number of pixels of other imaging regions of the image sensor is less, and the spacing between adjacent pixel points is greater, as shown in FIG. 3.

S103: Acquire images of the to-be-shot scene respectively based on the cameras after adjustment.

After adjustment on image sensors of the cameras in the camera array is completed, single-exposure can be performed, and the image sensors of the cameras in the camera array can acquire images of a photographed scene respectively. As, in image sensors of any two adjacent cameras of the camera array, corresponding logic pixel points have a distance equal to or near the sub-pixel level target offset distances as much as possible, therefore, contents of images of the photographed scene acquired by different image sensors are similar but have certain differences, and information of a certain object of the photographed scene not collected by a certain image sensor may be collected by the other image sensor.

S104: Acquire a super-resolution image of the to-be-shot scene according to the acquired images.

Figure 4:
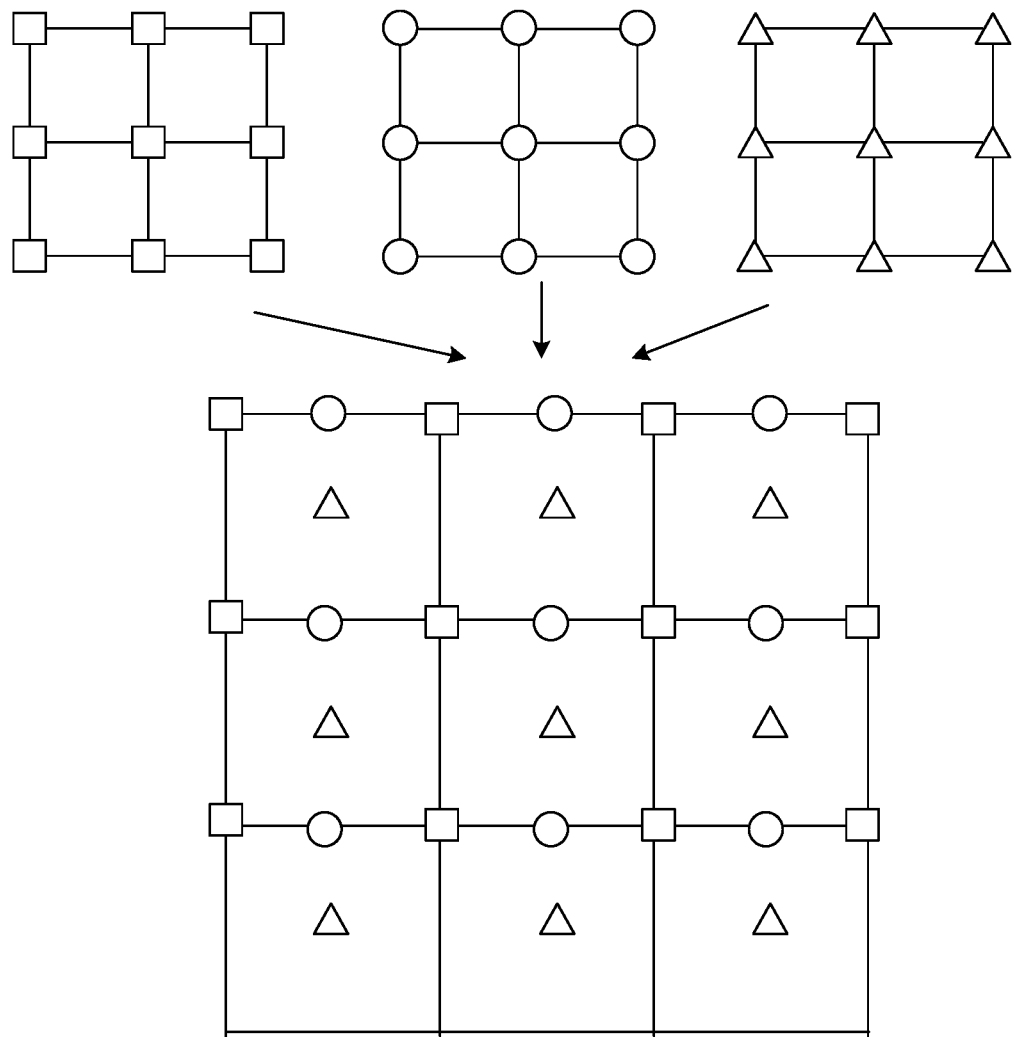
FIG. 4 is an example of generation of a super-resolution image according to embodiments of the present disclosure.

After images collected by the image sensors of the camera array are acquired, a super-resolution image may be obtained according to the images. For example, a new grid may be generated according to expected gain of the super-resolution image, various points of the grid and pixel points of the image sensors have a certain predetermined corresponding relationship therebetween, and image information of the pixel points in the images acquired by the image sensors may be inserted to corresponding points of the grid, as shown in FIG. 4, to thus obtain a super-resolution image. As the number of pixel points of imaging regions of any image sensor corresponding to image collection of the first region is more and actual pixel offset distances of the corresponding logic pixel points of the adjacent image sensors are equal to or near the sub-pixel level target offset distances as much as possible, parts of the images collected by the image sensors corresponding to the first region have richer details and have certain vision deviation, and resolution, SNR and other performance of a sub-image of the super-resolution image generated accordingly corresponding to the first region have improved.

The technical solution provided in the embodiments of the present disclosure can make full use of whole pixel points of respective image sensors of a camera array to acquire multiple different images of a to-be-shot scene with slight vision deviation, specifically, pixel point distribution of image sensors of respective cameras in the camera array can be adjusted according to sub-pixel level target offset distances of corresponding logic pixel points in respective to-be-adjusted regions, which respectively correspond to a first region of a to-be-shot scene, of image sensors of any two adjacent cameras, to cause the number of pixel points of imaging regions of the image sensors corresponding to the first region to be more under the condition that the sub-pixel level target offset distances are met, that is to say, pixel points are concentrated in the first region as many as possible in the event that the pixel points of the image sensors meet the sub-pixel level target offset distances, to cause the image sensors, on the basis of meeting sub-pixel level offset required by the super-resolution image, to increase pixel points of the to-be-adjusted regions to improve image acquisition efficiency, thereby increasing resolution of a sub-image, in the images acquired by the image sensors, corresponding to the first region, and images acquired by adjacent cameras have vision deviation corresponding to the sub-pixel level target offset distances therebetween, thereby improving imaging quality of a sub-image in the acquired super-resolution image corresponding to the first region.

Optionally, the acquisition method further comprises: acquiring default sub-pixel level offset distances of corresponding logic pixel points in image sensors of the any two adjacent cameras; and correspondingly, the determining sub-pixel level target offset distances comprises: determining the sub-pixel level target offset distances at least according to the default sub-pixel level offset distances, to cause the sub-pixel level target offset distances to be less than the default sub-pixel level offset distances. For the camera array, in order that a super-resolution image can be acquired according to images of the same scene acquired by image sensors of the cameras, in addition to that arrangement positions, baseline offsets and other factors of the cameras in the camera array introduce certain shoot vision differences, the corresponding logic pixel points in image sensors of the any two adjacent cameras further have a specific sub-pixel level offset distance therebetween, that is, the "default sub-pixel level offset distance" in the embodiments of the present disclosure. The solution takes the existing default sub-pixel level offset distance of the camera array into account when determining the sub-pixel level target offset distance, the determined sub-pixel level target offset distance is less than the default sub-pixel level offset distance, to cause an offset distance between corresponding logic pixel points of imaging regions of the image sensors respectively corresponding to the first region to be less than the default sub-pixel level offset distance, for example, if the default sub-pixel level offset distance is half of a distance between centers of adjacent pixel points of an image sensor of any camera, i.e., $$\frac{d}{2},$$

the sub-pixel level target offset distance is less than $$\frac{d}{2},$$

pixel point distribution of the image sensor is adjusted according to the sub-pixel level target offset distance, to cause an offset between corresponding logic pixel points of imaging regions of image sensors of adjacent cameras respectively corresponding to the first region to be less than $$\frac{d}{2},$$

that is to say, under the condition that a sub-pixel offset distance is met, after adjustment, the number of pixel points of imaging regions of the image sensors corresponding to the first region increases, the offset between corresponding logic pixel points in imaging regions of different image sensors respectively corresponding to the first region decreases, and thus the pixel points of the image sensors are re-distributed, to cause the image sensors to have more pixel points to collect image information of the first region of a to-be-shot scene, which improves pertinence and efficiency of images collected separately by the image sensors, also improves resolution and SNR of a sub-image in the super-resolution image acquired based on the images corresponding to the first region, and can better meet diversified application demands of users or devices or other bodies.

Optionally, the determining sub-pixel level target offset distances comprises: determining the sub-pixel level target offset distances at least according to a distance between centers of any two adjacent pixel points of image sensors of one or more cameras. In an application of performing image collection on the to-be-shot scene based on the camera array, if the images acquired by the image sensors of the cameras of the camera array can collect more details of the first region based on single-exposure of the camera array, details of sub-images of the super-resolution image generated based on the images corresponding to the first region are richer, and the SNR is higher. For any two adjacent cameras of the camera array, suppose that corresponding logic pixel points of image sensors of two adjacent cameras in the same row have a distance offset of $$\frac{d}{m}$$

in the X direction, referring to FIG. 2b, in the process of performing pixel filling of a super-resolution grid, each time m pixel points appear, the two images will correspond to a repeated pixel point on the super-resolution grid, and the repeated pixel point is often of no help to improving imaging quality of the super-resolution image, therefore, it is hoped that such repeated pixel points are as few as possible, so as to obtain more pixel points conductive to improving the imaging quality of the super-resolution image.

To this end, the sub-pixel level target offset distances can be determined at least according to a distance between centers of any two adjacent pixel points of image sensors of one or more cameras, wherein the distance between centers of two adjacent pixel points of an image sensor of any camera may comprise: a distance between centers of any two adjacent pixel points in any row of the image sensor, and/or a distance between centers of any two adjacent pixel points in any column of the image sensor.

It might as well take that the sub-pixel level target offset distances are determined at least according to a distance between centers of any two adjacent pixel points in any row of image sensors of one or more cameras as an example for description. Suppose that corresponding logic pixel points of image sensors L, R of two adjacent cameras in the same row have a distance offset d in the X direction.

Relative coordinates of pixel points of the image sensor L on the row can be expressed as follows:

$$X_{Li}=X_{L0}+id_L \quad (1)$$

where $X_{L0}$ denotes a relative coordinate of the 0th pixel point of the image sensor L in a certain row, $d_L$ denotes a distance between centers of any two adjacent pixel points of the image sensor L in a certain row, i is an integer greater than 0 and less than N−1, N is the total number of pixel points of the image sensor L in the row, and $X_{Li}$ denotes a relative coordinate of the ith pixel point of the image sensor L in a certain row.

Relative coordinates of pixel points of the image sensor R on the row can be expressed as follows:

$$X_{Rj}=X_{R0}+jd_R=X_{L0}+\Delta d+jd_R \quad (2)$$

where $X_{R0}$ denotes a relative coordinate of the 0th pixel point of the image sensor R in a certain row, $d_R$ denotes a distance between centers of any two adjacent pixel points of the image sensor R in a certain row, j is an integer greater than 0 and less than N−1, N is the total number of pixel points of the image sensor R in the row, and $X_{Rj}$ denotes a relative coordinate of the jth pixel point of the image sensor R in a certain row; $\Delta d$ denotes a sub-pixel level target offset distance of corresponding logic pixel points of the image sensors L, R.

In order to reduce the probability that images acquired by the two image sensors L, R respectively correspond to the same pixel point in the super-resolution grid, it is necessary to meet:

$$|X_{Li}-X_{Rj}|\neq 0 \quad (3)$$

In combination with the formulas (1)-(3), the following formula can be obtained:

$$\Delta d \neq id_L - jd_R \quad (4)$$

As $\Delta d$ is the sub-pixel level offset distance, that is:

$$\Delta d < d, d=\min(d_L, d_R) \quad (5)$$

In the event that the two image sensors L, R are homogeneous image sensors, $d_L = d_R$. When the formula (4) and the formula (5) are met at the same time, the probability that images acquired by the two image sensors L, R respectively correspond to the same pixel point in the super-resolution grid can be reduced.

Such processing helps to obtain more effective pixel point information to acquire a super-resolution image, thus improving image quality of sub-images of the super-resolution image corresponding to the first region.

It may be understood that the sub-pixel level target offset distances may also be determined in combination with many factors such as the default sub-pixel level offset distances and a distance between centers of any two adjacent pixel points of image sensors of one or more cameras, which is not limited in the embodiments of the present disclosure.

Optionally, in the technical solution provided in the embodiments of the present disclosure, the super-resolution image acquisition method further comprises: determining the first region. The solution can pre-determine a part of a current to-be-shot scene (e.g., a region having higher requirements for image spatial resolution, or a region having lower requirements for image spatial resolution) as the first region according to actual needs, and can better meet users' personalized application demands.

Manners of determining the first region can be very flexible, which are not limited in the embodiments of the present disclosure. In some embodiments, the first region can be determined according to preview images of the to-be-shot scene acquired by the camera array, and the solution determines the first region based on the preview images, which can improve use convenience of the users.

Specific implementations of determining the first region based on the preview images can also be very flexible.

For example, the first region can be determined according to region of interest (ROI) information of the preview images, that is, ROI determination information can be acquired based on preview images of the camera array about the to-be-shot scene; and a region in the to-be-shot scene corresponding to the ROI determination information is determined as the first region. The ROI may comprise, but not limited to, one or more of the following: at least one region of the preview images selected by a user (i.e., a user selection region of the preview images), at least one region of the preview images gazed by the user (i.e., a user gaze region of the preview images), and an ROI obtained by automatically detecting the preview images by the camera array. The solution determines a part in the to-be-shot scene corresponding thereto as the first region according to the ROI of the preview images, to cause determination of the first region to more fit in with actual user demands, which can better meet users' personalized application demands.

For another example, the first region can be automatically determined according to image analysis results of the preview images, that is, image analysis can be performed on the preview images of the camera array about the to-be-shot scene; and the first region is determined according to a result of the image analysis. In one optional scene, face recognition can be performed on the preview images, and a face region of the to-be-shot scene corresponding to a face image is determined as the first region. The solution can determine a region in the to-be-shot scene corresponding thereto as the first region according to a result of the image analysis on the preview images, to cause determination of the first region to be more intelligent, thereby improving efficiency and universality of the determination of the first region.

After the first region has been determined, image regions in image sensors of respective cameras in the camera array respectively corresponding to the first region can be determined as respective to-be-adjusted regions of the image sensors of the respective cameras. Pixel point distribution of the image sensors are adjusted respectively according to the sub-pixel level target offset distances of corresponding logic pixel points of image sensors of adjacent cameras in the camera array. For example, actual pixel point offset distances of the corresponding logic pixel points after adjustment in the respective to-be-adjusted regions can be equal to the sub-pixel level target offset distances, and the solution causes an adjustment result to fit in with expectation of bodies such as users or devices. Alternatively, for example, differences between actual pixel point offset distances of the corresponding logic pixel points after adjustment in the respective to-be-adjusted regions and the sub-pixel level target offset distances fall within a predetermined range of tolerance. The solution causes an adjustment result to fit in with expectation of bodies such as users or devices as much as possible.

During actual applications, the manner of adjusting pixel point distribution of image sensors of the cameras can be selected according to actual needs, which is not limited in the embodiments of the present disclosure. In one optional implementation, deformation control information of controllable deformed material portions of image sensors of the respective cameras is determined according to the sub-pixel level target offset distances; and the controllable deformed material portions are controlled to produce deformation according to the deformation control information, so as to correspondingly adjust the pixel point distribution of the image sensors of the respective cameras through the deformation of the controllable deformed material portions. The solution adjusts pixel point distribution of the image sensors by controlling deformation of the controllable deformed material portions, which is simple and easy to implement.

The controllable deformed material portions can produce deformation by changing a certain external effect factor (such as an external field) acting on the controllable deformed material portion, and when the external field acting thereon is cancelled or changed, the deformation of the controllable deformed material portions can be restored.

Figure 1B:
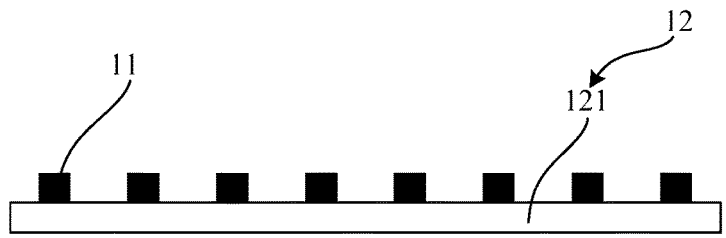
FIG. 1b is an example schematic structural diagram of an image sensor with adjustable pixel density according to embodiments of the present disclosure.

FIG. 1b is a schematic structural diagram of an image sensor with adjustable pixel density according to embodiments of the present disclosure. As shown in FIG. 1b, the image sensor with adjustable pixel density provided in the embodiments of the present disclosure comprise: a plurality of image sensor pixels 11 and a controllable deformed material portion 12, wherein the image sensor performs image collection through the image sensor pixels 11, the plurality of image sensor pixels 11 is array-distributed, and the controllable deformed material portion 12 is connected with the plurality of image sensor pixels 11 respectively; the controllable deformed material portion 12 may produce deformation under the action of an external field, and distribution of the plurality of image sensor pixels 11 is correspondingly adjusted through the deformation of the controllable deformed material portion 12.

In the technical solution provided in the embodiments of the present disclosure, the controllable deformed material portion can produce deformation by changing a certain external field effect factor on the controllable deformed material portion, when the certain external field effect factor is cancelled or changed, the deformation of the controllable deformed material portion can be restored, and a corresponding control external field acting thereon may be selected as the external field with respect to deformation characteristics of the controllable deformed material portion, for example, the external field comprises, but is not limited to, an external electric field, a magnetic field, a light field and the like. The image sensor pixels may comprise, but are not limited to, at least one photoelectric conversion unit. Each of the image sensor pixels and the controllable deformed material portion may be closely connected in a manner which comprises, but is not limited to, adhesion. In this way, when the controllable deformed material portion produces deformation, spacing between the image sensor pixels will be adjusted correspondingly, thus changing pixel point distribution of the image sensor pixels and achieving the effect of giving differentiated pixel density distribution to different regions of the image sensor according to actual requirements.

During actual applications, an unevenly distributed external field can act on different regions of the controllable deformed material portion, to cause different regions of the controllable deformed material portion to produce deformation differently, thus adjusting the overall density distribution of the image sensor pixels. Optionally, the external field can act on a region where the controllable deformed material portion and the plurality of image sensor pixels do not overlap, to cause a region where the controllable deformed material portion and the plurality of image sensor pixels overlap not to produce deformation, the pixel point distribution of the image sensor is changed through deformation of other parts of the controllable deformed material portion, and the solution helps to avoid damage to the image sensor pixels caused by deformation of the controllable deformed material portion.

During actual applications, at least one suitable controllable deformed material can be selected as required to prepare the controllable deformed material portion, to cause the controllable deformed material portion to have characteristics of being deformable and having recoverable deformation. Optionally, the controllable deformed material portion is at least prepared from at least one or more of the following controllable deformed materials: piezoelectric materials, electroactive polymers, photodeformation materials and magnetostriction materials.

The piezoelectric materials may produce mechanical deformation due to the action of an electric field. The controllable deformed material portion prepared from the piezoelectric materials is hereinafter referred to as a piezoelectric material portion. By use of such a physical property of the piezoelectric material, the embodiments of the present disclosure can determine electric field control information configured to make the piezoelectric material portion produce corresponding mechanical deformation according to, but not limited to, the sub-pixel level target offset distances, control an electric field acting on the piezoelectric material portion according to the electric field control information, to cause the piezoelectric material portion to produce corresponding mechanical deformation, and correspondingly adjust pixel point distribution of the image sensor through the mechanical deformation of the piezoelectric material portion, thus achieving the purpose of adjusting pixel density distribution of the image sensor according to the sub-pixel level target offset distances. The piezoelectric materials may comprise, but are not limited to, at least one of the following: piezoelectric ceramic and piezoelectric crystal. The solution can make full use of the physical property of the piezoelectric material to adjust pixel point distribution of the image sensor.

The Electroactive Polymers (referred to as EAPs) are one kind of polymer materials that can change their shapes or sizes under the action of an electric field. The controllable deformed material portion prepared from the EAPs is hereinafter referred to as an EAP portion. By use of such a physical property of the EAPs, the embodiments of the present disclosure can determine electric field control information configured to make the EAP portion produce corresponding deformation according to, but not limited to, the sub-pixel level target offset distances, control an electric field acting on an EAP layer according to the electric field control information, to cause the EAP layer to produce corresponding deformation, and correspondingly adjust pixel point distribution of the image sensor through the deformation of the EAP layer, thus achieving the purpose of adjusting pixel point distribution of the image sensor according to the sub-pixel level target offset distances. The EAP materials may comprise, but are not limited to, at least one of the following: electronic EAPs and ionic EAPs; the electronic EAPs comprise at least one of the following: ferroelectric polymers (such as polyvinylidene fluoride), electrostrictive grafted elastomers and liquid crystal elastomers; and the ionic EAPs comprise at least one of the following: electrorheological fluids, ionic polymer-metallic composite materials and the like. The solution can make full use of the physical property of the EAPs to adjust pixel point distribution of the image sensor.

The photodeformation materials are one kind of polymer materials that can change their shapes or sizes under the action of a light field. The controllable deformed material portion prepared from the photodeformation materials is hereinafter referred to as a photodeformation material portion. By use of such a physical property of the photodeformation materials, the embodiments of the present disclosure can determine light field control information configured to make the photodeformation material portion produce corresponding deformation according to, but not limited to, the sub-pixel level target offset distances, control a light field acting on the photodeformation material portion according to the light field control information, to cause the photodeformation material portion to produce corresponding deformation, and correspondingly adjust pixel point distribution of the image sensor through the deformation of the photodeformation material portion, thus achieving the purpose of adjusting pixel point distribution of the image sensor according to the sub-pixel level target offset distances. The photodeformation materials may comprise, but are not limited to, at least one of the following: photostrictive ferroelectric ceramics and photodeformation polymers; the photostrictive ferroelectric ceramics comprise, but are not limited to, lead lanthanum zirconate titanate (PLZT) ceramics, and the photodeformation polymers comprise, but are not limited to, photodeformation liquid crystal elastomers. The solution can make full use of the physical property of the photodeformation material to adjust pixel point distribution of the image sensor.

The magnetostriction materials are one kind of magnetic materials that can change a magnetization state thereof under the action of a magnetic field and then change their sizes. The controllable deformed material portion prepared from the magnetostriction materials is hereinafter referred to as a magnetostriction material portion. By use of such a physical property of the magnetostriction materials, the embodiments of the present disclosure can determine magnetic field control information configured to make the magnetostriction material produce corresponding deformation according to, but not limited to, the sub-pixel level target offset distances, control a magnetic field acting on the magnetostriction material portion according to the magnetic field control information, to cause the magnetostriction material portion to produce corresponding deformation, and correspondingly adjust pixel point distribution of the image sensor through the deformation of the magnetostriction material portion, thus achieving the purpose of adjusting pixel point distribution of the image sensor according to the sub-pixel level target offset distances. The magnetostriction materials may comprise, but are not limited to, rare-earth giant magnetostrictive materials, such as alloy $Tbo_{0.3}Dy_{0.7}Fe_{1.95}$ materials using a (Tb,Dy)Fe$_2$ compound as a substrate. The solution can make full use of the physical property of the magnetostriction material to adjust pixel point distribution of the image sensor.

In the technical solution provided in the embodiments of the present disclosure, specific structures and connecting modes of the image sensor pixels and the controllable deformed material portion can be determined according to actual requirements, and the actual modes are very flexible.

In some embodiments, as shown in FIG. 1b, the controllable deformed material portion 12 comprises: a controllable deformed material layer 121, the plurality of image sensor pixels 11 being array-distributed and connected to one side of the controllable deformed material layer 121. Optionally, it is feasible to choose to directly from the plurality of image sensor pixels on the controllable deformed material portion 12 according to actual process conditions, or the plurality of image sensor pixels and the controllable deformed material portion 12 can be prepared respectively and can be closely connected in a manner which comprises, but is not limited to, adhesion. The solution has a simple structure and is easy to achieve.

Figure 1C:
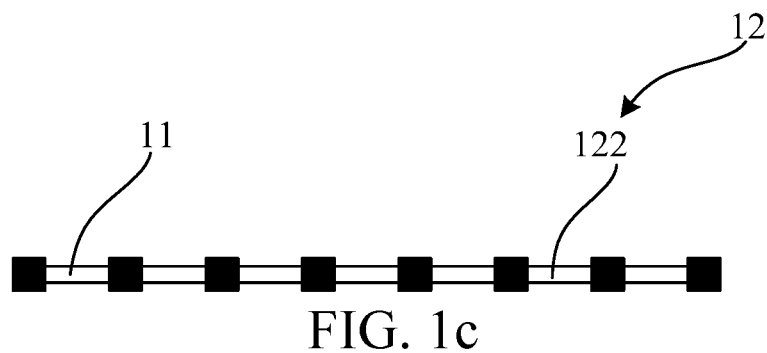
FIG. 1c is an example schematic structural diagram of an image sensor with adjustable pixel density according to embodiments of the present disclosure.

In some embodiments, as shown in FIG. 1c, the controllable deformed material portion 12 comprises a plurality of controllable deformed material connecting sub-portions 122, the plurality of controllable deformed material connecting sub-portions 122 being array-distributed, so as to correspondingly connect the plurality of image sensor pixels 11 array-distributed, that is, the plurality of image sensor pixels array-distributed are connected into one piece through the plurality of controllable deformed material connecting sub-portions array-distributed. Optionally, the plurality of controllable deformed material connecting sub-portions can be formed in space regions of pixels of an image sensor pixel array according to an actual process, and the plurality of controllable deformed material connecting sub-portions and the corresponding image sensor pixels may be connected in a manner which comprises, but is not limited to, abutment and adhesion. The pixel point distribution of the image sensor can be adjusted by controlling deformation of the plurality of controllable deformed material connecting sub-portions, the structure is simple, and implementation is easy.

Figure 1D:
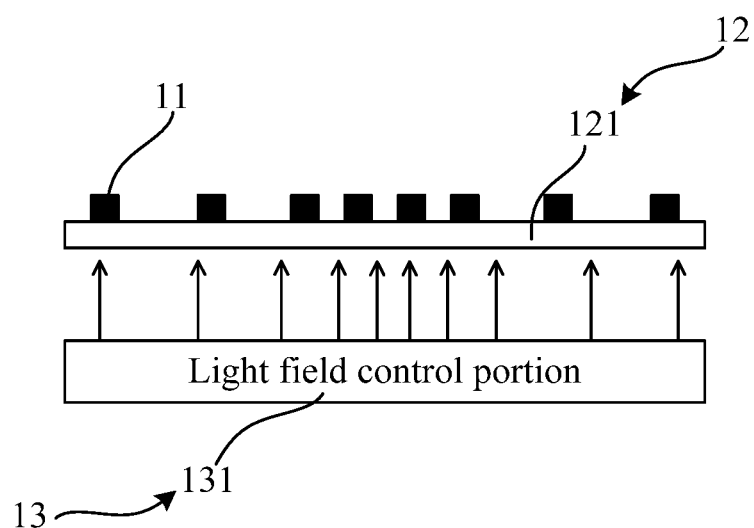
FIG. 1d is an example schematic structural diagram of an image sensor with adjustable pixel density according to embodiments of the present disclosure.
Figure 1E:
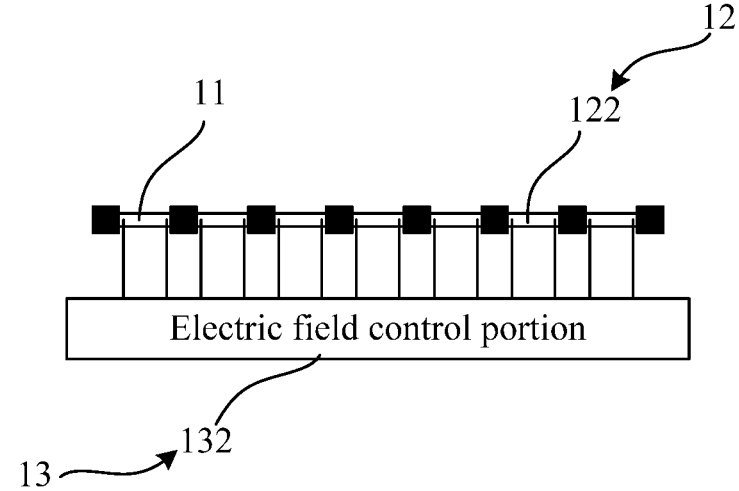
FIG. 1e is an example schematic structural diagram of an image sensor with adjustable pixel density according to embodiments of the present disclosure.

Further, as shown in FIG. 1d and FIG. 1e, the image sensor may further comprise: a deformation control portion 13, wherein the deformation control portion 13 is configured to adjust distribution of the external field acting on the controllable deformed material portion 12, so as to control the controllable deformed material portion 12 to produce corresponding deformation, in this way, when the controllable deformed material portion 12 produces deformation, the spacing between the image sensor pixels 11 may be adjusted correspondingly, thus changing pixel point distribution of the image sensor and achieving the effect of giving differentiated pixel point distribution to different regions of the image sensor according to actual requirements.

Optionally, as shown in FIG. 1d, the deformation control portion comprises a light field control portion 131, wherein the light field control portion 131 is configured to adjust distribution of an external light field acting on the controllable deformed material portion 12, so as to control the controllable deformed material portion 12 to produce corresponding deformation. In this case, the controllable deformed material portion 12 may comprise a photodeformation material portion at least prepared from photodeformation materials, for example, the photodeformation material portion may comprise a photodeformation material layer at least prepared from the photodeformation materials, or the controllable deformed material portion may comprise a plurality of photodeformation material connecting sub-portions at least prepared from the photodeformation materials. The light field control portion 131 excites different regions of the controllable deformed material portion 12 to produce deformation differently by changing light field distribution acting on the photodeformation material portion (in FIG. 1d, the light field with different intensity distribution acting on the controllable deformed material portion 12 is represented through arrow density), and the spacing between the image sensor pixels 11 is adjusted correspondingly through the deformation of the controllable deformed material portion 12, thus changing pixel point distribution of the image sensor pixels 11 and achieving the effect of giving differentiated pixel point distribution to different regions of the image sensor according to actual requirements.

Figure 1F:
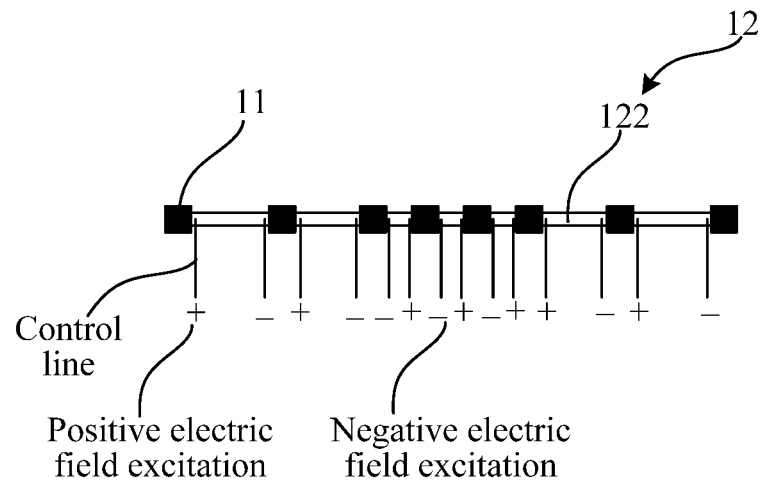
FIG. 1f is an example of a scene where an image sensor adjusts pixel density in the event of uneven light field excitation according to embodiments of the present disclosure.

Optionally, as shown in FIG. 1e, the deformation control portion comprises an electric field control portion 132, wherein the electric field control portion 132 is configured to adjust distribution of an external electric field acting on the controllable deformed material portion, so as to control the controllable deformed material portion to produce corresponding deformation. In this case, the controllable deformed material portion 12 may comprise a piezoelectric material portion at least prepared from piezoelectric materials (such as a piezoelectric material layer or a piezoelectric material connecting sub-portion), or the controllable deformed material portion 12 may comprise an EAP portion at least prepared from EAPs (such as an EAP layer or an EAP connecting sub-portion). As shown in FIG. 1e, the electric field control portion and the controllable deformed material can be connected through a control line, and the electric field control portion 132 excites different regions of the controllable deformed material portion 12 to produce deformation differently by changing electric field distribution acting on the controllable deformed material portion. If the electric field acting on the controllable deformed material portion 12 is a zero field, the controllable deformed material portion does not produce deformation (might as well be called zero field excitation); if intensity distribution of the electric field acting on the controllable deformed material portion 12 (for example, "+" positive electric field excitation and "−" negative electric field excitation shown in FIG. 1e) is changed to cause the intensity of the electric field acting on different regions of the controllable deformed material portion 12 to vary, as shown in FIG. 1f, in this way, the different regions of the controllable deformed material portion 12 may produce deformation differently, and the spacing between the image sensor pixels 11 is adjusted correspondingly through the deformation of the controllable deformed material portion 12, thus changing the overall pixel point distribution of the image sensor and achieving the effect of giving differentiated pixel density distribution to different regions of the image sensor according to actual requirements.

In the embodiments of the present disclosure, the controllable deformed portion and the deformation control portion may be directly or indirectly connected. The deformation control portion may serve as a part of the image sensor, or the deformation control portion may not serve as a part of the image sensor, and the image sensor may also be connected with the deformation control portion through a reserved pin or interface or the like. The external field acting on the controllable deformed material portion may comprise, but is not limited to, an electric field, a magnetic field, a light field and the like. A hardware or software structure configured to produce the electric field, a hardware or software structure configured to produce the magnetic field, a hardware or software structure configured to produce the light field and the like can be achieved by using corresponding existing technologies according to actual requirements, which is no longer repeated herein in the embodiments of the present disclosure.

Figure 1G:
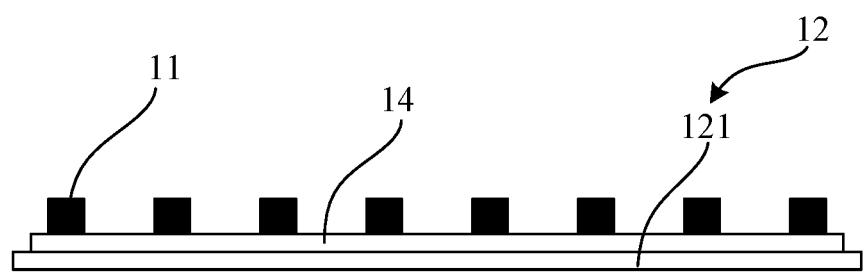
FIG. 1g is an example schematic structural diagram of an image sensor with adjustable pixel density according to embodiments of the present disclosure.
Figure 1H:
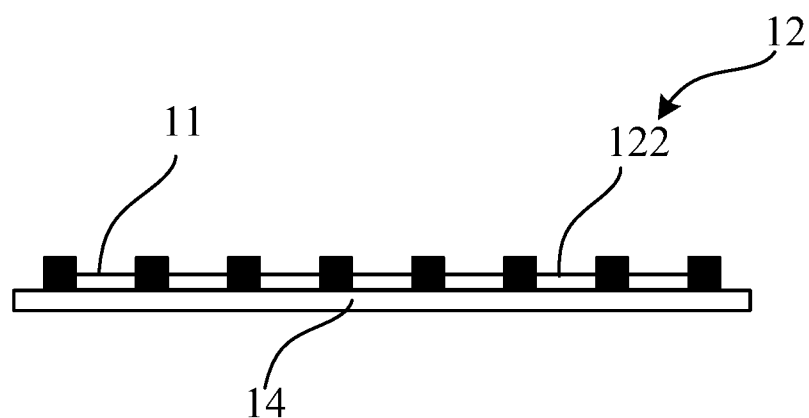
FIG. 1h is an example schematic structural diagram of an image sensor with adjustable pixel density according to embodiments of the present disclosure.

Optionally, the image sensor may further comprise a flexible substrate, and the flexible substrate may comprise, but is not limited to, a flexible plastic substrate, which has certain flexibility and can change the shape of the flexible substrate according to requirements. The image sensor pixels and the controllable deformed material portion may be disposed on the same side or different sides of the flexible substrate. For example, as shown in FIG. 1g, the plurality of image sensor pixels 11 are connected to one side of the flexible substrate 14, and the controllable deformed material portion (for example, the controllable deformed material layer 121) is connected to the other side of the flexible substrate 14. For another example, as shown in FIG. 1h, the plurality of image sensor pixels 11 are connected to one side of the flexible substrate 14, and the controllable deformed material portion (for example, the controllable deformed material connecting sub-portion 122) is connected to the corresponding image sensor pixel and is located on the same side of the flexible substrate 14 with the image sensor pixel 11. The solution not only can indirectly adjust the overall pixel point distribution of the image sensor by controlling its deformation through the external field acting on the controllable deformed material portion, to achieve adjustable pixel density of the image sensor, but also can flexibly change the shape of the image sensor due to use of the flexible substrate, for example, a plane image sensor is bent to a certain angle to obtain a surface image sensor, thus meeting application demands such as diversified image acquisition and decoration.

Figure 1I:
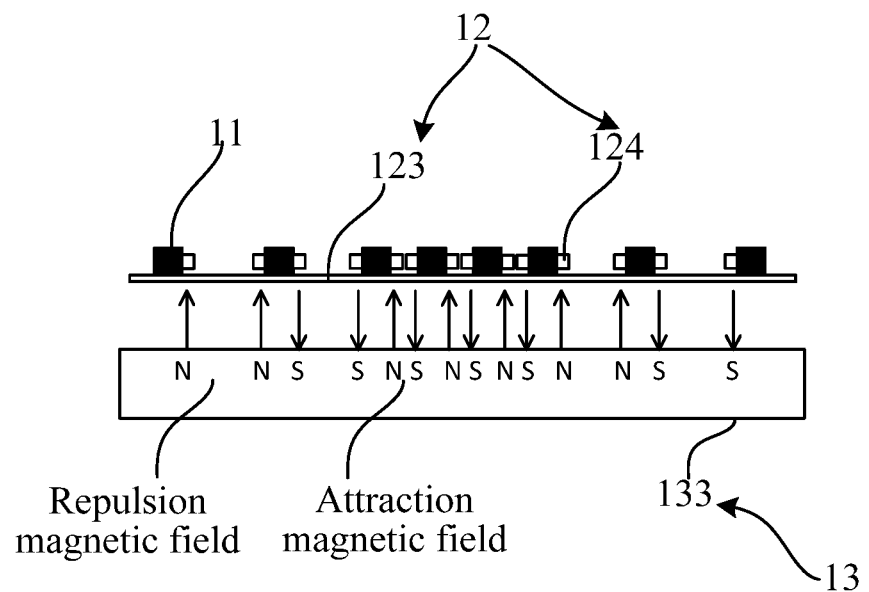
FIG. 1i is an example schematic structural diagram of an image sensor with adjustable pixel density according to embodiments of the present disclosure.

FIG. 1i is a schematic structural diagram of an image sensor with adjustable pixel density according to embodiments of the present disclosure. In the image sensor as shown in FIG. 1i, the controllable deformed material portion 12 comprises: a flexible substrate 123 and a plurality of permeability magnetic material portions 124; the plurality of image sensor pixels 11 are respectively connected with the flexible substrate 123, at least a part of the image sensor pixels 11 are connected with the plurality of permeability magnetic material portions 124, the flexible substrate 123 produces corresponding deformation by changing a magnetic field acting on the permeability magnetic material portions 124, and density distribution of the plurality of image sensor pixels 11 is correspondingly adjusted through the deformation. For example, a permeability magnetic material portion 124 can be disposed on a side face of each image sensor pixel, and optionally, the image sensor pixel 11 is respectively adhered to the flexible substrate 123 and the permeability magnetic material portion 124. The permeability magnetic material portion may comprise a magnetic pole prepared from a permeability magnetic material, and the permeability magnetic material may comprise, but is not limited to, one or more of a soft magnetic material, a silicon steel sheet, a permalloy, ferrite, an amorphous soft magnetic alloy, and a super-microcrystalline soft magnetic alloy. The permeability magnetic material portion prepared from the soft magnetic material has better permeability, and small residual magnetization after cancellation of the magnetic field facilitates next adjustment.

Further, optionally, the deformation control portion 13 in the embodiments of the present disclosure may further comprise: a magnetic field control portion 133, wherein the magnetic field control portion 133 is configured to adjust distribution of an external magnetic field acting on the controllable deformed material portion, so as to control the controllable deformed material portion to produce corresponding deformation. For example, when the magnetic field control portion 133 controls the magnetic field (that is, excitation magnetic field) acting on the permeability magnetic material portion 124, as shown in FIG. 1i, a like magnetic pole (NN or SS) repulsion magnetic field or an unlike magnetic pole (NS or SN) attraction magnetic field with certain magnetic field intensity distribution is applied between adjacent image sensor pixels, the poles may produce a corresponding repelling force or attracting force therebetween, the magnetic force is transferred to the flexible substrate 123 to make the flexible substrate 123 produce deformation such as expansion and contraction, thereby resulting in that the spacing between the corresponding image sensor pixels changes and achieving the purpose of adjusting pixel point distribution of the image sensor. The solution achieves adjustable pixel point distribution of the image sensor in combination with scalable deformation characteristics of the flexible substrate and the magnetic field control principle.

Figure 1J:
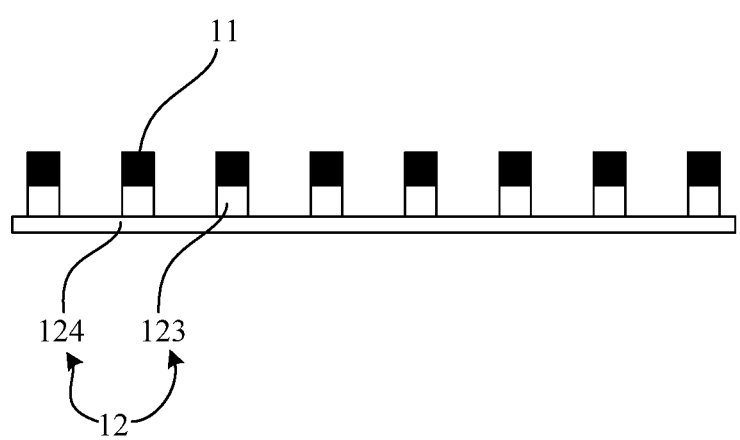
FIG. 1j is an example schematic structural diagram of an image sensor with adjustable pixel density according to embodiments of the present disclosure.

FIG. 1*j* is a schematic structural diagram of an image sensor with adjustable pixel density according to embodiments of the present disclosure. In the image sensor as shown in FIG. 1*j*, the controllable deformed material portion 12 comprises: a flexible substrate 123 and a plurality of permeability magnetic material portions 124; one side of the plurality of permeability magnetic material portions 124 is respectively connected with the flexible substrate 123, an opposite face of the plurality of permeability magnetic material portions 124 is respectively connected with the plurality of image sensor pixels 11 correspondingly, the flexible substrate 123 produces corresponding deformation by changing a magnetic field acting on the permeability magnetic material portions 124, and density distribution of the plurality of image sensor pixels 11 is correspondingly adjusted through the deformation. Optionally, the permeability magnetic material portions 124 are adhered to the flexible substrate 123, the image sensor pixels 11 are adhered to the permeability magnetic material portions 124, and when the magnetic field acting on the permeability magnetic material portions 124 changes, the magnetic force is transferred to the flexible substrate 123 to make the flexible substrate 123 produce deformation such as expansion and contraction, thereby achieving the purpose of adjusting pixel point distribution of the image sensor. The solution achieves adjustable pixel point distribution of the image sensor in combination with scalable deformation characteristics of the flexible substrate and the magnetic field control principle.

It should be understood by those skilled in the art that, in the embodiments of the present disclosure, the value of the serial number of each step described above does not mean an execution sequence, and the execution sequence of each step should be determined according to the function and internal logic thereof, and should not be limited to the aforementioned examples.

Figure 5:
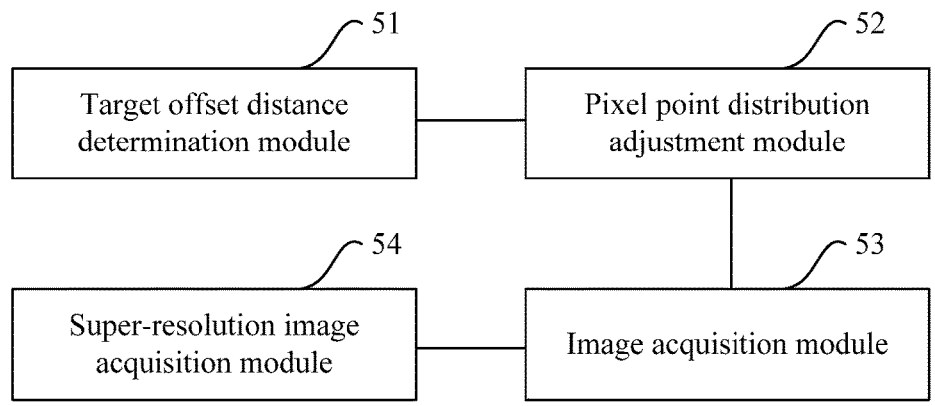
FIG. 5 is an example logic block diagram of one super-resolution image acquisition apparatus according to embodiments of the present disclosure.

FIG. 5 is a logic block diagram of one super-resolution image acquisition apparatus according to embodiments of the present disclosure. As shown in FIG. 5, a super-resolution image acquisition apparatus according to the embodiments of the present disclosure comprises: a target offset distance determination module 51, a pixel point distribution adjustment module 52, an image acquisition module 53 and a super-resolution image acquisition module 54.

The target offset distance determination module 51 is configured to determine sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a to-be-shot scene.

The pixel point distribution adjustment module 52 is configured to adjust pixel point distribution of image sensors of respective cameras in the camera array according to the sub-pixel level target offset distances. Actual pixel point offset distances of the corresponding logic pixel points after adjustment in the respective to-be-adjusted regions are equal to the sub-pixel level target offset distances, or differences between actual pixel point offset distances of the corresponding logic pixel points after adjustment in the respective to-be-adjusted regions and the sub-pixel level target offset distances fall within a predetermined range of tolerance.

The image acquisition module 53 is configured to acquire images of the to-be-shot scene respectively based on the cameras after adjustment.

The super-resolution image acquisition module 54 is configured to acquire a super-resolution image of the to-be-shot scene according to the acquired images.

The super-resolution image acquisition apparatus provided in the embodiments of the present disclosure may perform static or dynamic image processing control by executing the super-resolution image acquisition method during applications, which comprise, but are not limited to, phototaking, camera shooting, photographing and video monitoring. Device manifestations of the super-resolution image acquisition apparatus are not limited, for example, the super-resolution image acquisition apparatus may be a certain separate component, and the component cooperates with the camera array for communications; or the super-resolution image acquisition apparatus may be integrated into a camera array as a certain functional module, which is not limited in the embodiments of the present disclosure.

The technical solution provided in the embodiments of the present disclosure can make full use of whole pixel points of respective image sensors of a camera array to acquire multiple different images of a to-be-shot scene with slight vision deviation, specifically, pixel point distribution of image sensors of respective cameras in the camera array can be adjusted according to sub-pixel level target offset distances of corresponding logic pixel points in respective to-be-adjusted regions, which respectively correspond to a first region of a to-be-shot scene, of image sensors of any two adjacent cameras, to cause the number of pixel points of imaging regions of the image sensors corresponding to the first region to be more under the condition that the sub-pixel level target offset distances are met, that is to say, pixel points are concentrated in the first region as many as possible in the event that the pixel points of the image sensors meet the sub-pixel level target offset distances, to cause the image sensors, on the basis of meeting sub-pixel level offset required by the super-resolution image, to increase pixel points of the to-be-adjusted regions to improve image acquisition efficiency, thereby increasing resolution of a sub-image, in the images acquired by the image sensors, corresponding to the first region, and images acquired by adjacent cameras have vision deviation corresponding to the sub-pixel level target offset distances therebetween, thereby improving imaging quality of a sub-image in the acquired super-resolution image corresponding to the first region.

Figure 6:
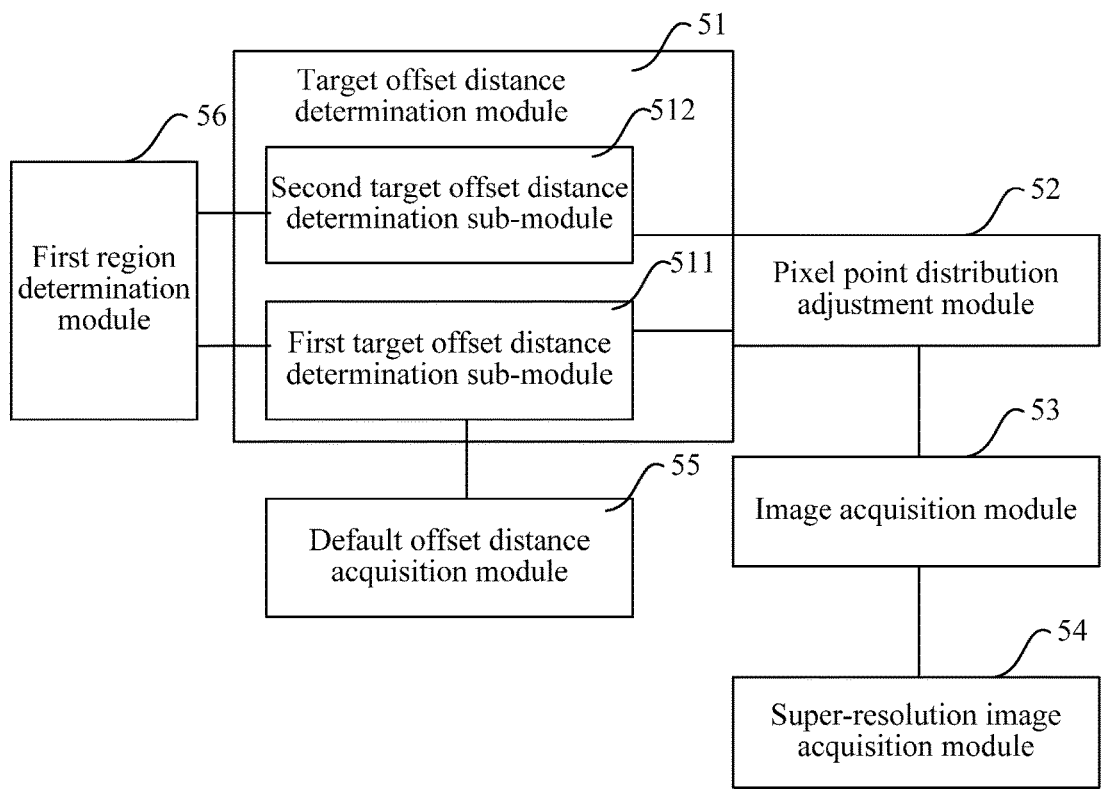
FIG. 6 is an example logic block diagram of another super-resolution image acquisition apparatus according to embodiments of the present disclosure.

Optionally, as shown in FIG. 6, the acquisition apparatus further comprises: a default offset distance acquisition module 55. The default offset distance acquisition module 55 is configured to acquire default sub-pixel level offset distances of corresponding logic pixel points in image sensors of the any two adjacent cameras. In this case, the target offset distance determination module 51 comprises: a first target offset distance determination sub-module 511; wherein the first target offset distance determination sub-module 511 is configured to determine the sub-pixel level target offset distances at least according to the default sub-pixel level offset distances, to cause the sub-pixel level target offset distances to be less than the default sub-pixel level offset distances. The solution takes the existing default sub-pixel level offset distance of the camera array into account when determining the sub-pixel level target offset distance, the determined sub-pixel level target offset distance is less than the default sub-pixel level offset distance, to cause a distance between centers of any two adjacent pixel points of imaging regions of the image sensors respectively corresponding to the first region to be less than the default sub-pixel level offset distance, that is to say, under the condition that a sub-pixel offset distance is met, after adjustment, the number of adjacent pixel points of imaging regions of the image sensors corresponding to the first region increases, the spacing between adjacent pixel points in imaging regions of different image sensors respectively corresponding to the first region decreases, and thus the pixel points of the image sensors are re-distributed, to cause the image sensors to have more pixel points to collect image information of the first region of a to-be-shot scene, which improves pertinence and efficiency of images collected separately by the image sensors, also improves resolution and SNR of a sub-image in the super-resolution image acquired based on the images corresponding to the first region, and can better meet diversified application demands of users or devices or other bodies.

Optionally, the target offset distance determination module 51 comprises: a second target offset distance determination sub-module 512; wherein the second target offset distance determination sub-module 512 is configured to determine the sub-pixel level target offset distances at least according to a distance between centers of any two adjacent pixel points of image sensors of one or more cameras. The solution helps to obtain more effective pixel point information to acquire a super-resolution image, thus improving image quality of sub-images of the super-resolution image corresponding to the first region.

Optionally, the acquisition apparatus further comprises: a first region determination module 56. The first region determination module 56 is configured to determine the first region. The solution can pre-determine a part of a current to-be-shot scene as the first region according to actual needs, and can better meet users' personalized application demands.

Figure 7:
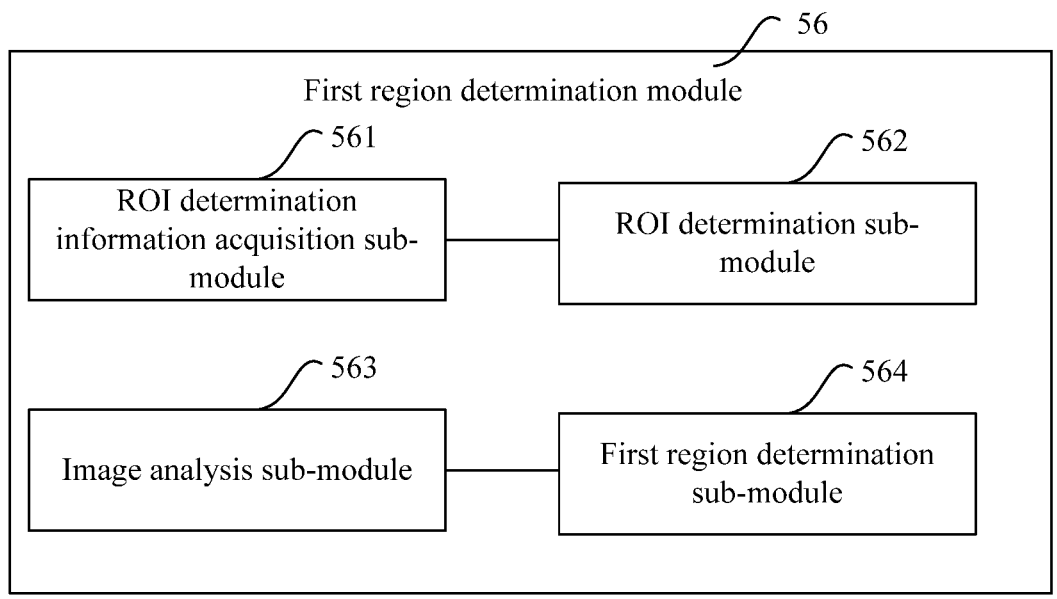
FIG. 7 is an example logic block diagram of a first region determination module according to embodiments of the present disclosure.

Optionally, as shown in FIG. 7, the first region determination module 56 comprises: an ROI determination information acquisition sub-module 561 and an ROI determination sub-module 562. The ROI determination information acquisition sub-module 561 is configured to acquire ROI determination information based on preview images of the camera array about the to-be-shot scene; and the ROI determination sub-module 562 is configured to determine a region in the to-be-shot scene corresponding to the ROI determination information as the first region. The solution determines a part in the to-be-shot scene corresponding thereto as the first region according to the ROI of the preview images, to cause determination of the first region to more fit in with actual user demands, which can better meet users' personalized application demands.

Optionally, the first region determination module 56 comprises: an image analysis sub-module 563 and a first region determination sub-module 564. The image analysis sub-module 563 is configured to perform image analysis on the preview images of the camera array about the to-be-shot scene; and the first region determination sub-module 564 is configured to determine the first region according to a result of the image analysis. The solution can determine a region in the to-be-shot scene corresponding thereto as the first region according to a result of the image analysis on the preview images, to cause determination of the first region to be more intelligent, thereby improving efficiency and universality of the determination of the first region.

Figure 8:
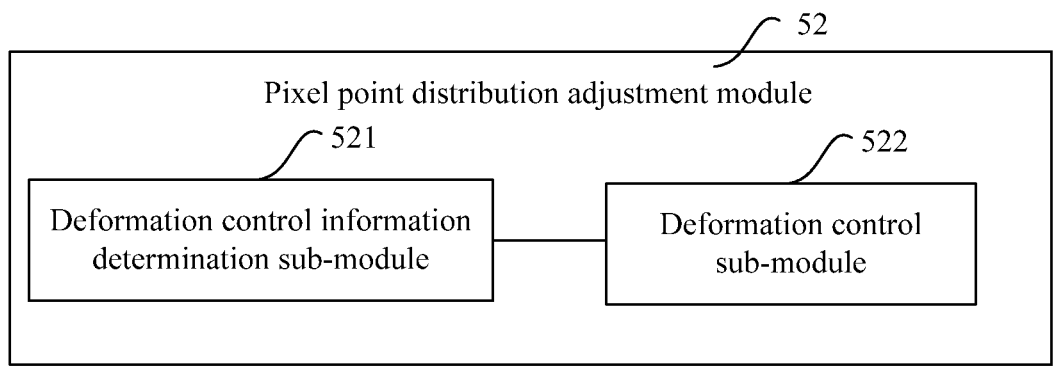
FIG. 8 is an example logic block diagram of a pixel point distribution adjustment module according to embodiments of the present disclosure.

Optionally, as shown in FIG. 8, the pixel point distribution adjustment module 52 comprises: a deformation control information determination sub-module 521 and a deformation control sub-module 522. The deformation control information determination sub-module 521 is configured to determine deformation control information of controllable deformed material portions of image sensors of the respective cameras according to the sub-pixel level target offset distances; and the deformation control sub-module 522 is configured to control the controllable deformed material portions to produce deformation according to the deformation control information, so as to correspondingly adjust the pixel point distribution of the image sensors of the respective cameras through the deformation of the controllable deformed material portions. The solution adjusts pixel point distribution of the image sensors by controlling deformation of the controllable deformed material portions, which is simple and easy to implement. The controllable deformed material portions are at least prepared from at least one or more of the following controllable deformed materials: piezoelectric materials, electroactive polymers, photodeformation materials and magnetostriction materials.

Figure 9:
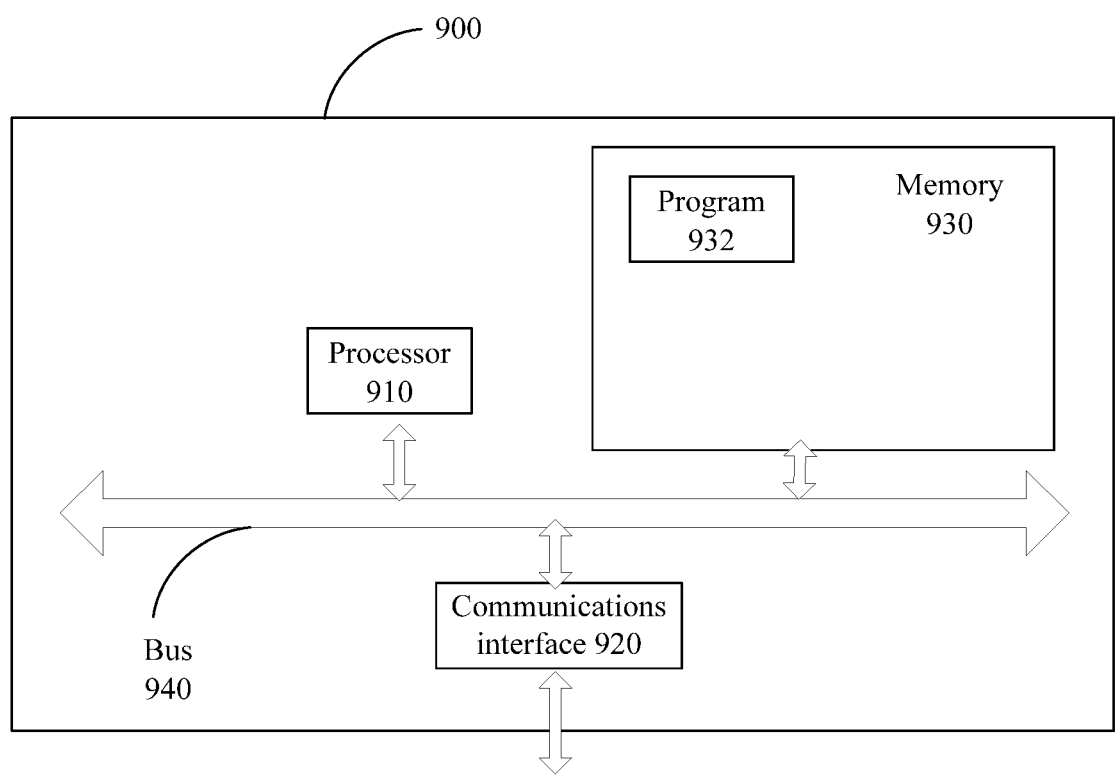
FIG. 9 is an example logic block diagram of a further super-resolution image acquisition apparatus according to embodiments of the present disclosure.

FIG. 9 is a logic block diagram of another light field acquisition and control apparatus according to embodiments of the present disclosure. The scope of the present disclosure does not is not limited to the light field acquisition and control apparatus 900. As shown in FIG. 9, the light field acquisition and control apparatus 900 may comprise:

a processor 910, a Communications Interface 920, a memory 930, and a communications bus 940.

The processor 910, the Communications Interface 920, and the memory 930 accomplish mutual communications via the communications bus 940.

The Communications Interface 920 is configured to communicate with, for example, devices or external light sources with a communications function.

The processor 910 is configured to execute a program 932, and specifically, can implement relevant steps in any embodiment of the light field acquisition and control method.

Specifically, the program 932 may comprise a program code, the program code comprising a computer operation instruction.

The processor 910 may be a central processing unit (CPU), or an application specific integrated circuit (ASIC), or be configured to be one or more integrated circuits which implement the method embodiments.

The memory 930 is configured to store the program 932. The memory 930 may comprise a high-speed RAM memory, and may also comprise a non-volatile memory, for example, at least one magnetic disk memory.

For example, in one optional implementation, the processor 910 may perform the following steps by executing the program 932: determining sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a to-be-shot scene; adjusting pixel point distribution of image sensors of respective cameras in the camera array according to the sub-pixel level target offset distances; acquiring images of the to-be-shot scene respectively based on the cameras after adjustment; and acquiring a super-resolution image of the to-be-shot scene according to the acquired images.

In other optional implementations, the processor 910 may further perform the steps mentioned in the any other embodiments by executing the program 932, which is not repeated herein.

Reference can be made to corresponding description in the corresponding steps, modules, sub-modules and units in the embodiments for specific implementation of the steps in the program 932, which is not repeated herein. Those skilled in the art can clearly understand that, reference can be made to the corresponding process description in the method embodiments for the devices described above and the specific working procedures of the modules, and will not be repeated herein in order to make the description convenient and concise.

Optionally, the image sensor of any camera in the camera array may be the flexible image sensor described above. Alternatively, the image sensor may further comprise: a plurality of image sensor pixels array-distributed; and a controllable deformed material portion respectively connected with the plurality of image sensor pixels; wherein the controllable deformed material portion can produce deformation under the action of an external field, and density distribution of the plurality of image sensor pixels is correspondingly adjusted through the deformation; the external field is controlled by the imaging control apparatus.

Reference can be made to the corresponding description in FIG. 1b to FIG. 1j for the structure of an image sensor, the super-resolution image acquisition apparatus can directly control the external field to control deformation of the controllable deformed material portion, thereby adjusting pixel point distribution of the corresponding image sensor; or the super-resolution image acquisition apparatus can indirectly control the external field by controlling the deformation control portion, to cause the controllable deformed material portion to produce corresponding deformation to correspondingly adjust pixel point distribution of the image sensor; and so on. A manner of physical connection between the image sensor pixels and the deformed material portion can be determined according to actual needs, as long as the manner can meet that pixel density distribution of the image sensor can be adjusted when the deformed material portion produces deformation, which is not limited in the embodiments of the present disclosure, and reference can be made to the corresponding description above for a specific implementation thereof, which is not repeated herein.

In the various embodiments of the present application, the serial numbers and/or sequence numbers of the foregoing embodiments are merely for the convenience of description, and do not imply the preference among the embodiments. Particular emphasis is put on the description about each embodiment, and reference can be made to relevant description of other embodiments for the content not detailed in a certain embodiment. Reference can be made to the description about the corresponding method embodiments for related description about the implementation principle or process of relevant apparatus, device or system embodiments, which is not repeated herein.

It can be appreciated by those of ordinary skill in the art that each exemplary unit and method step described with reference to the embodiments disclosed herein can be implemented by electronic hardware or a combination of computer software and electronic hardware. Whether these functions are executed in a hardware mode or a software mode depends on particular applications and design constraint conditions of the technical solution. The professional technicians can use different methods to implement the functions described with respect to each particular application, but such implementation should not be considered to go beyond the scope of the present application.

If the functions are implemented in the form of a software functional unit and is sold or used as an independent product, it can be stored in a computer-readable storage medium. Based on such understanding, the technical solution of the present application essentially or the part which contributes to the prior art or a part of the technical solution can be embodied in the form of a software product, and the computer software product is stored in a storage medium, and comprises several instructions for enabling a computer device (which can be a personal computer, a server, or a network device, and the like) to execute all or some steps of the method described in each embodiment of the present disclosure. The foregoing storage medium comprises, a USB disk, a removable hard disk, a read-only memory (ROM), a random access memory (RAM), a magnetic disk, an optical disk or any other mediums that can store program codes.

In the embodiments of the apparatuses, methods and systems of the present application, it is apparent that the members (systems, sub-systems, modules, sub-modules, units, sub-units, and the like) or the steps can be decomposed, combined and/or recombined after decomposition. The decomposition and/or recombination should be regarded as equivalent solutions of the present application. Moreover, in the description about the embodiments of the present application, features described and/or illustrated with respect to one implementation may be used in one or more other implementations in the same or a similar manner, be combined with features in other implementations, or replace the features in other implementations.

It should be emphasized that, the term "comprise" used herein refers to existence of features, elements, steps or components, but does not exclude existence or addition of one or more other features, elements, steps or components.

Finally, it should be noted that, the above implementations are only intended to describe the present application rather than to limit the present application; various changes and variations can be made by those of ordinary skill in the art without departing from the spirit and scope of the present application, so all equivalent technical solutions also belong to the category of the present application, and the scope of patent protection of the present application should be defined by the claims.

What is claimed is:

1. A super-resolution image acquisition method implemented by a system comprising a processor, comprising:
   determining sub-pixel level target offset distances of logic pixel points associated with to-be-adjusted regions of image sensors of any two adjacent cameras of a camera array, the respective to-be-adjusted regions being imaging regions of the image sensors respectively corresponding to a first region, and the first region being at least part of a scene;
   adjusting pixel point distribution of image sensors of respective cameras in the camera array according to the sub-pixel level target offset distances;
   acquiring images of the scene respectively based on the cameras after adjustment; and
   acquiring a super-resolution image of the scene according to the acquired images.

2. The acquisition method of claim 1, wherein
   the acquisition method further comprises: acquiring default sub-pixel level offset distances of corresponding logic pixel points in image sensors of the any two adjacent cameras; and
   the determining sub-pixel level target offset distances comprises: determining the sub-pixel level target offset distances at least according to the default sub-pixel level offset distances, to cause the sub-pixel level target offset distances to be less than the default sub-pixel level offset distances.

3. The acquisition method of claim 2, wherein the determining sub-pixel level target offset distances comprises: determining the sub-pixel level target offset distances at least according to a distance between centers of any two adjacent pixel points of image sensors of one or more cameras.

4. The acquisition method of claim 1, wherein the acquisition method further comprises: determining the first region.

5. The acquisition method of claim 4, wherein the determining the first region comprises:
acquiring region of interest (ROI) determination information based on preview images of the camera array about the scene; and
determining a region in the scene corresponding to the ROI determination information as the first region.

6. The acquisition method of claim 4, wherein the determining the first region comprises:
performing image analysis on the preview images of the camera array about the scene; and
determining the first region according to a result of the image analysis.

7. The acquisition method of claim 1, wherein actual pixel offset distances of the corresponding logic pixel points after adjustment in the respective to-be-adjusted regions are equal to the sub-pixel level target offset distances.

8. The acquisition method of claim 1, wherein differences between actual pixel offset distances of the corresponding logic pixel points after adjustment in the respective to-be-adjusted regions and the sub-pixel level target offset distances fall within a predetermined range of tolerance.

9. The acquisition method of claim 1, wherein the adjusting pixel point distribution of image sensors in respective cameras in the camera array according to the sub-pixel level target offset distances comprises:
determining deformation control information of controllable deformed material portions of image sensors of the respective cameras according to the sub-pixel level target offset distances; and
controlling the controllable deformed material portions to produce deformation according to the deformation control information, so as to correspondingly adjust the pixel point distribution of the image sensors of the respective cameras through the deformation of the controllable deformed material portions.

10. The acquisition method of claim 7, wherein the controllable deformed material portion is at least prepared from at least one or more of the following controllable deformed materials: piezoelectric materials, electroactive polymers, photodeformation materials and magnetostriction materials.

11. A super-resolution image acquisition apparatus, comprising a processor, coupled to a memory, that executes or facilitates execution of executable modules, the executable modules comprising:
a target offset distance determination module, configured to determine sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a scene;
a pixel point distribution adjustment module, configured to adjust pixel point distribution of image sensors of respective cameras in the camera array according to the sub-pixel level target offset distances;
an image acquisition module, configured to acquire images of the scene respectively based on the cameras after adjustment; and
a super-resolution image acquisition module, configured to acquire a super-resolution image of the scene according to the acquired images.

12. The acquisition apparatus of claim 11, wherein the execution modules further comprise:
a default offset distance acquisition module, configured to acquire default sub-pixel level offset distances of corresponding logic pixel points in image sensors of the any two adjacent cameras; and
wherein the target offset distance determination module comprises: a first target offset distance determination sub-module, configured to determine the sub-pixel level target offset distances at least according to the default sub-pixel level offset distances, to cause the sub-pixel level target offset distances to be less than the default sub-pixel level offset distances.

13. The acquisition apparatus of claim 11, wherein the target offset distance determination module comprises: a second target offset distance determination sub-module, configured to determine the sub-pixel level target offset distances at least according to a distance between centers of any two adjacent pixel points of image sensors of one or more cameras.

14. The acquisition apparatus of claim 11, wherein the execution modules further comprise:
a first region determination module, configured to determine the first region.

15. The acquisition apparatus of claim 14, wherein the first region determination module comprises:
a region of interest (ROI) determination information acquisition sub-module, configured to acquire ROI determination information based on preview images of the camera array about the scene; and
an ROI determination sub-module, configured to determine a region in the scene corresponding to the ROI determination information as the first region.

16. The acquisition apparatus of claim 14, wherein the first region determination module comprises:
an image analysis sub-module, configured to perform image analysis on the preview images of the camera array about the scene; and
a first region determination sub-module, configured to determine the first region according to a result of the image analysis.

17. The acquisition apparatus of claim 11, wherein actual pixel offset distances of the corresponding logic pixel points after adjustment in the respective to-be-adjusted regions are equal to the sub-pixel level target offset distances.

18. The acquisition apparatus of claim 11, wherein differences between actual pixel offset distances of the corresponding logic pixel points after adjustment in the respective to-be-adjusted regions and the sub-pixel level target offset distances fall within a predetermined range of tolerance.

19. The acquisition apparatus of claim 11, wherein the pixel point distribution adjustment module comprises:
a deformation control information determination sub-module, configured to determine deformation control information of controllable deformed material portions of image sensors of the respective cameras according to the sub-pixel level target offset distances; and a deformation control sub-module, configured to control the controllable deformed material portions to produce deformation according to the deformation control information, so as to correspondingly adjust the pixel point distribution of the image sensors of the respective cameras through the deformation of the controllable deformed material portions.

20. The acquisition apparatus of claim 19, wherein the controllable deformed material portions are at least prepared from at least one or more of the following controllable deformed materials: piezoelectric materials, electroactive polymers, photodeformation materials and magnetostriction materials.

21. A non-transitory computer readable storage medium that stores at least one executable instruction which, when executed by a processor of an apparatus, causes the apparatus to perform a super-resolution image acquisition method, the method comprising:
  determining sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a scene;
  adjusting pixel point distribution of image sensors of respective cameras in the camera array according to the sub-pixel level target offset distances;
  acquiring images of the scene respectively based on the cameras after adjustment; and
  acquiring a super-resolution image of the scene according to the acquired images.

22. A super-resolution image acquisition apparatus, comprising a processor and a memory, the memory storing computer executable instructions, the processor being connected to the memory through a communication bus, and when the apparatus for controlling task migration operates, the processor executing the computer executable instructions stored in the memory, so that the apparatus for controlling task migration executes operations, comprising:
  determining sub-pixel level target offset distances of corresponding logic pixel points in respective to-be-adjusted regions of image sensors of any two adjacent cameras of a camera array, the respective to-be-adjusted regions being imaging regions of the image sensors respectively corresponding to a first region, and the first region being at least a local part of a scene;
  adjusting pixel point distribution of image sensors of respective cameras in the camera array according to the sub-pixel level target offset distances;
  acquiring images of the scene respectively based on the cameras after adjustment; and
  acquiring a super-resolution image of the scene according to the acquired images.

* * * * *